(12) United States Patent
Takemura et al.

(10) Patent No.: US 7,633,833 B2
(45) Date of Patent: Dec. 15, 2009

(54) SEMICONDUCTOR MEMORY DEVICE

(75) Inventors: Riichiro Takemura, Tokyo (JP); Tomonori Sekiguchi, Tama (JP); Satoru Akiyama, Sagamihara (JP); Hiroaki Nakaya, Kokubunji (JP); Masayuki Nakamura, Tokyo (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 110 days.

(21) Appl. No.: 12/028,788

(22) Filed: Feb. 9, 2008

(65) Prior Publication Data

US 2008/0239865 A1 Oct. 2, 2008

(30) Foreign Application Priority Data

Mar. 29, 2007 (JP) ............... 2007-088693

(51) Int. Cl.
*G11C 8/00* (2006.01)

(52) U.S. Cl. ............ 365/233.11; 365/149; 365/194

(58) Field of Classification Search ........... 365/149, 365/194, 233.11

See application file for complete search history.

(56) References Cited

U.S. PATENT DOCUMENTS

| | | | |
|---|---|---|---|
| 5,619,170 A | 4/1997 | Nakamura | |
| 6,247,138 B1 | 6/2001 | Tamura et al. | |
| 6,862,247 B2 * | 3/2005 | Yamazaki | 365/230.03 |
| 2002/0024366 A1 | 2/2002 | Ooishi et al. | |

FOREIGN PATENT DOCUMENTS

| | | | |
|---|---|---|---|
| JP | 7-288447 A | 10/1995 |
| JP | 11-3587 A | 1/1999 |
| JP | 2002-74949 A | 3/2002 |

\* cited by examiner

*Primary Examiner*—Hoai V Ho
(74) *Attorney, Agent, or Firm*—Miles & Stockbridge P.C.

(57) ABSTRACT

The semiconductor memory device according to the invention is provided with a first delay circuit block that generates a timing signal of a circuit block to be operated in column cycle time determined by an external input command cycle and a second delay circuit block the whole delay of which is controlled to be a difference between access time determined by an external clock and the latency and column cycle time. These delay circuit blocks are controlled so that the delay of each delay circuit is a suitable value in accordance with column latency and an operating frequency, and each delay is controlled corresponding to dispersion in a process and operating voltage and a change of operating temperature.

18 Claims, 26 Drawing Sheets

SEMICONDUCTOR MEMORY DEVICE

CLAIM OF PRIORITY

The present application claims priority from Japanese application JP 2007-088693, filed on Mar. 29, 2007, the content of which is hereby incorporated by reference into this application.

BACKGROUND OF THE INVENTION

1. Field of the Invention

The present invention relates to a semiconductor memory device, particularly relates to a control signal generator of a memory array for realizing stable operation at different external clock frequencies.

2. Description of the Related Arts

Synchronous DRAM (SDRAM) realizes a high-speed data rate by inputting and outputting a command and data in synchronization with an external clock. Recently, double data rate (DDR) SDRAM, DDR2 SDRAM and DDR3 SDRAM that respectively realize a further higher-speed data rate are developed. Of these DRAMs, a column command (read/write) can be input to SDRAM and DDR SDRAM every clock cycle from an external device. In DDR2 SDRAM, it can be input every two clocks and in DDR3 SDRAM, it can be input every 4 clocks. In the meantime, in SDRAM, one data is output every clock and in DDR SDRAM, DDR2 SDRAM and DDR3 SDRAM, data is output at a leading edge and at a trailing edge of a clock.

Corresponding to this, an array is operated in column command input cycle time. Access time since a read command is input until data is output to an external device is required to be time defined by column latency. The column latency is set so that it is high at a high-speed operating frequency and is low at a low-speed operating frequency. Hereby, access time can be substantially fixed both at a high-speed clock frequency and at a low-speed clock frequency.

This reason is that operating speed (access time) since an array receives a command until it outputs data is not fast (not short). However, an operational cycle of an array is determined by an external command input cycle. As a result, for a change of clock cycle time, the variation of access time decreases, however, array cycle time varies by the quantity of the variation of the clock cycle time.

Inside DRAM, asynchronous operation is performed using delay circuits. According to speedup, the delay time of a delay circuit configured by a normal inverter greatly varies depending upon the lowering of voltage, the miniaturization of a device and an operating temperature condition as shown in FIG. 24. As shown in FIG. 24, on a condition of low temperature, a fast device and high voltage, the delay time is a half of the delay time on a condition of high temperature, a slow device and low voltage. As the output timing of timing signals widely varies when the timing signal that determines internal operational timing is generated using such a delay circuit, an operational margin inside DRAM is deteriorated. In the meantime, as disclosed in JP-A No. 1995-288447, JP-A No. 2002-074949 and JP-A No. 1999-003587, it is proposed that an internal node signal of PLL locked in operation cycle time and DLL is utilized for a timing signal. In these techniques, as a timing signal is output at the timing of fixed times of a clock cycle determined in units of a circuit based upon access time, an effect of dispersion among delay circuits can be removed.

SUMMARY OF THE INVENTION

However, in this method of generating timing in a column cycle using the access time, the following problem occurs. The access time of DRAM is determined by a clock frequency input from an external device and column latency CL specified by an external device and set in a mode register.

In the meantime, a cycle in which each circuit is operated and an operation cycle of an array (a column cycle) are determined by a minimum column command input cycle. That is, the column cycle is determined according to the specification of DRAM, is equivalent to one clock cycle in SDRAM and DDR SDRAM, and is equivalent to two clock cycles in DDR2 SDRAM. At this time, depending upon the setting of column latency and an operating clock frequency, the column cycle may be the same access time. FIG. 25 shows waveforms of internal operation when column latency is set to 4 and a clock frequency is set to 533 MHz. FIG. 26 shows waveforms of internal operation in continuous read operation when column latency CL is set to 5 and a clock frequency is set to 667 MHz. In both cases, a timing signal is generated so that the operating clock frequency of 533 MHz and the access time of 15 ns are met. In both cases, access time since a command is input until data is output is 15 ns. As the column cycle of 7.5 ns is actually required in the case of the clock frequency of 667 MHz though the column cycle of 6 ns is to be met when a method of generating timing signals for operating an internal circuit in column access time is used for such an array, column cycle operation is not met and the collision of data occurs in the array. Conversely, as a chip with bad performance is operated at the similar rate to 667 MHz though the chip is to be operated at the clock frequency of 533 MHz when a clock frequency is set to 667 MHz, a problem that the operational margin is deteriorated occurs.

That is, an object of the invention is to provide a control signal generator that not only adjusts the operation cycle time of one control signal to column cycle time but adjusts operating time difference among plural control signals to the column cycle time.

Representatives for achieving the object will be described below.

One of the representatives is a semiconductor memory device provided with a first clock having first cycle time in which an external signal including a control signal is input with the external signal synchronous, a second clock generated in synchronization with the control signal and a first delay circuit block to which the second clock is input, which has predetermined delay time and outputs a signal where the first delay circuit block is provided with a second delay circuit block including plural first delay circuits the sum of the respective delay time of which is adjusted to M times (M: natural number) of the first cycle time and a third delay circuit block including plural second delay circuits the sum of the respective delay time of which is adjusted to N times (N: natural number) of the first cycle time.

That is, the object can be achieved by using the two delay circuit groups of the delay circuits controlled by access time and the delay circuits controlled by column command input cycle time for a circuit for generating a timing signal in a column cycle.

According to the invention, when the same access time is realized at different external clock frequencies, a timing signal for internal operation in a column cycle can be output so that both an array operation cycle determined by an external clock frequency and access time determined by column latency and a clock frequency are met and stable operation can be realized in a wide frequency range.

DETAILED DESCRIPTION OF THE PREFERRED EMBODIMENTS

Figure 1:
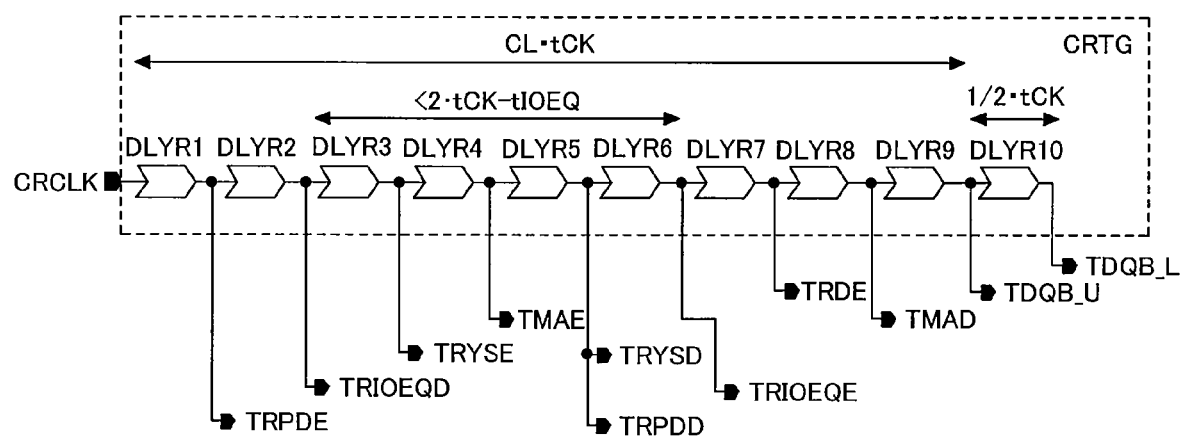
FIG. 1 shows an example of the configuration of a column read timing signal generating circuit.

Referring to the drawings, embodiments of the invention will be described in detail below.

A circuit element forming each block in the embodiments is not particularly limited, however, the circuit element is formed on one semiconductor substrate made of monocrystalline silicon and others. A metal oxide semiconductor field effect transistor (MOSFET) without an arrow denotes N-type MOSFET (NMOSFET) and is distinguished from P-type MOSFET (PMOSFET) with an arrow. The MOSFET will be briefly called MOS below. However, the invention is not limited to only a field effect transistor including an oxide insulating film provided between a metal gate and a semiconductor layer and is applied to a circuit using general FET such as a metal insulator semiconductor field effect transistor (MISFET).

FIG. 1 shows the embodiment of the invention. FIG. 1 shows an example of the configuration of a timing control circuit for controlling the timing of column operation in a read command for a dynamic random access memory (DRAM). A characteristic of this configuration is that a timing signal that defines the operational timing of each circuit block in a column cycle is generated by two of (1) a delay circuit block calibrated based upon access time determined by the product (CL·tCK) of an external clock frequency and column latency and (2) a delay circuit block set based upon a minimum command input cycle, that is, column cycle time. Hereby, when operative clock frequencies are different even if access time is the same, stable array column operation and operation that meets access time are enabled. This embodiment will be described using an example of double-data-rate 2 (DDR2) SDRAM below.

Figure 2:
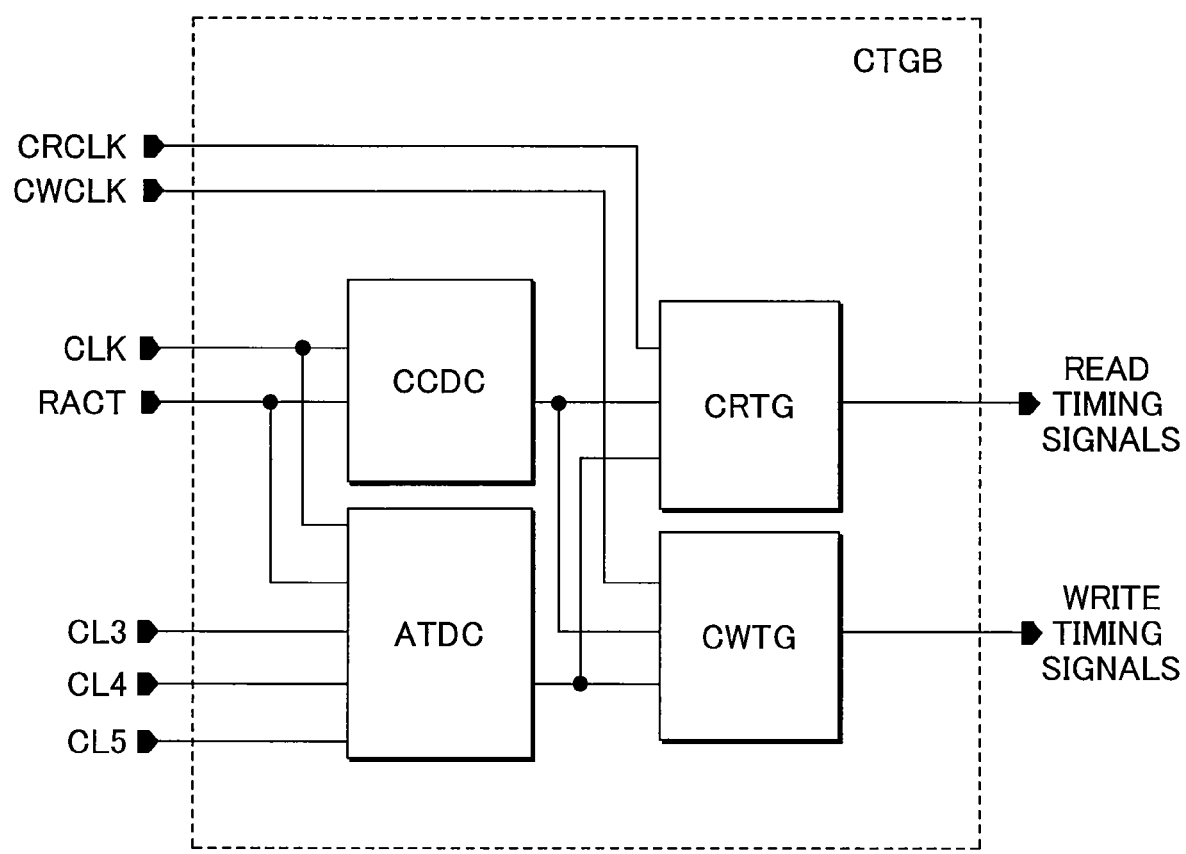
FIG. 2 shows an example of a column timing control circuit.

FIG. 2 shows the whole of a column timing control circuit CTGB. The column timing control circuit CTGB includes the column read timing control circuit CRTG shown in FIG. 1, a column write timing control circuit CWTG, a delay control circuit for a column cycle CCDC and a delay control circuit for access time ATDC. An external clock CLK, a row activating signal RACT, a column read clock CRCLK corresponding to an operational mode of an external command, a column write clock CWCLK and signals CL3, CL4, CL5 corresponding to a value of column latency CL set for a mode register from an external device, for example, 3, 4, 5 are input to the column timing control circuit CTGB.

First, the read timing control circuit CRTG will be described. FIG. 1 shows the column read timing signal generating circuit CRTG which is a part of the column timing signal generating circuit block CTGB that generates a timing signal. Delay circuits DLYR1 to DLYR10 configure a delay circuit block that realizes desired delay time. The sum of the delay time of the delay circuits DLYR3, DLYR4, DLYR5, DLYR6 that offer an MIO equalization disabling timing signal TRIOEQD to an MIO equalization enabling timing signal TRIOEQE respectively required to be operated in a command input cycle, that is, in a column operation cycle is controlled by the delay control circuit for a column cycle CCDC described later so that the sum is equal to a result of "the column operation cycle—MIO equalized time (tIOEQ)". In the meantime, the sum of the delay time of the delay circuits DLYR1, DLYR2, DLYR7, DLYR8, DLYR9 out of DLYR1 to DLYR10 is controlled by the delay control circuit for access time ATDC described later so that the sum is equal to time equivalent to a product (tCK×(CL−2)) of clock cycle time tCK and (column latency CL−2). In this case, column operation cycle time is equivalent to external clock cycle time tCK in DDR SDRAM, is 2·tCK equivalent to the double of the external clock cycle time in DDR2 SDRAM, and is 4·tCK equivalent to the quadruple of the external clock cycle time tCK in DDR3 SDRAM.

In this case, based upon a column read clock CRCLK generated when a command is input from an external device, there are output a predecoding enabling timing signal TRPDE for initiating the predecoding of an input address, a predecoding disabling timing signal TRPDD for resetting the output of a predecoder, a timing signal TRIOEQD for stopping the equalization of a data I/O line MIO of a read array, the MIO equalization enabling timing signal TRIOEQE for initiating the equalization of the data I/O line MIO, a column selection signal enabling timing signal TRYSE for activating a column selection signal YS corresponding to the input address, a column selection signal disabling timing signal TRYSD, a main amplifier activating timing signal TMAE for amplifying a microwave on the data I/O line MIO by a main amplifier MA, a main amplifier disabling timing signal TMAD for deactivating the main amplifier, a read data latch timing signal TRDE for determining timing for sending read data to an output buffer and output enabling signals TDQB_U and TDQB_L for determining timing for sending first and second data output in accordance with leading and trailing edges of an external clock out of latched data to an I/O buffer DQ.

Figure 3:
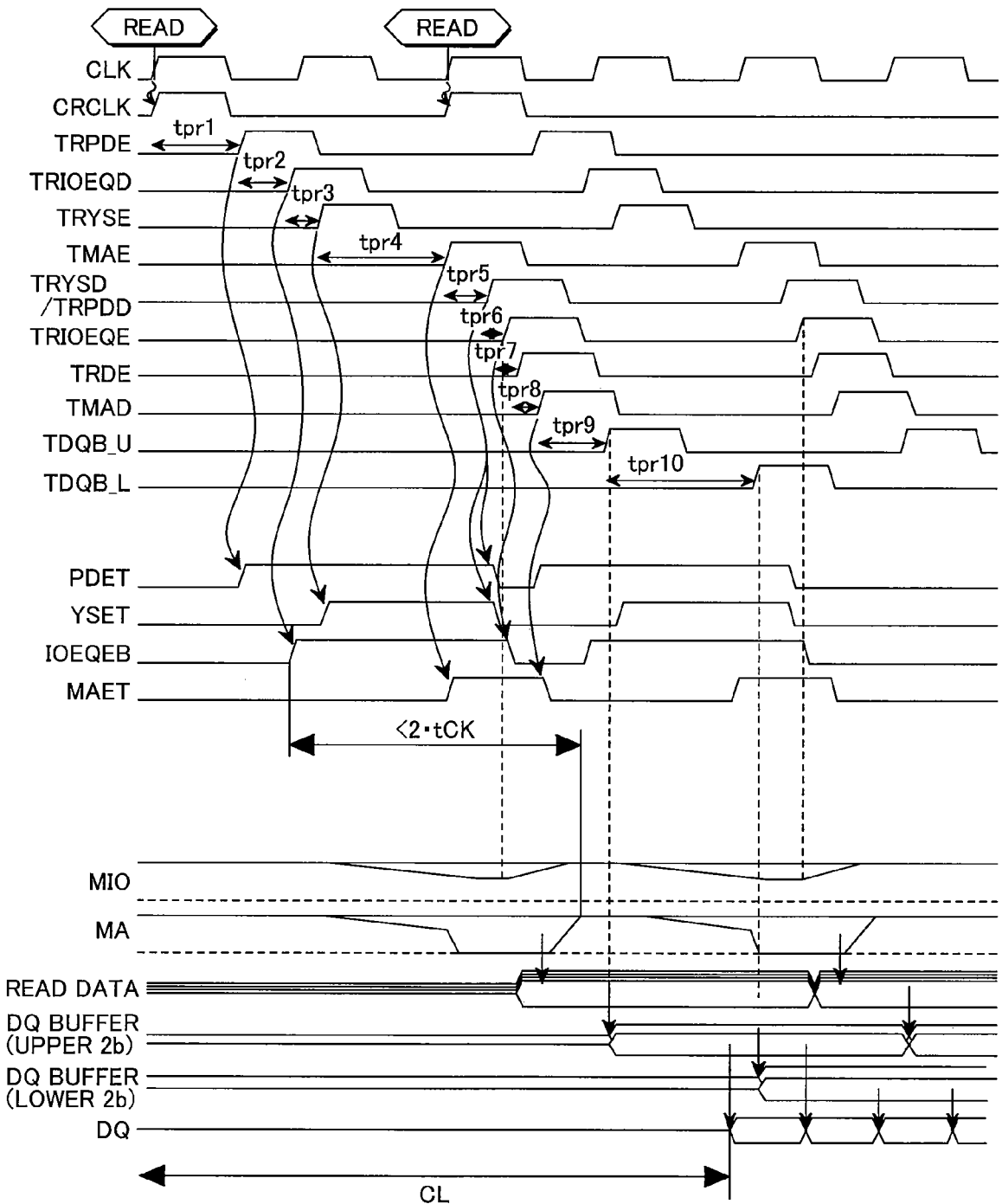
FIG. 3 shows an example of operational waveforms of the column read timing signal generating circuit.

FIG. 3 shows operational timing waveforms. In FIG. 3, the operational waveforms when a read command (READ) is input in a minimum command input cycle (tCCD) are shown. The column read clock CRCLK is generated at an edge of the external clock CLK when a read command is input and is input to the delay circuit DLYR1. The delay circuit DLYR1 outputs the column predecoding enabling timing signal TRPDE after delay time tpr1 controlled by the delay control circuit for access time ATDC. Next, the output of the delay circuit DLYR1 is input to the delay circuit DLYR2. The delay circuit DLYR2 outputs the MIO equalization disabling timing signal TRIOEQD after delay time tpr2 controlled by the delay control circuit for access time ATDC like the delay circuit DLYR1. Next, the output of the delay circuit DLYR2 is input to the delay circuit DLYR3. The delay circuit DLYR3 outputs the column selection signal enabling timing signal TRYSE after delay time tpr3 controlled by the delay control circuit for a column cycle CCDC.

Next, the output of the delay circuit DLYR3 is input to the delay circuit DLYR4. The delay circuit DLYR4 outputs the main amplifier enabling timing signal TMAE after delay time tpr4 controlled by the delay control circuit for a column cycle CCDC like the delay circuit DLYR3. Next, the output of the delay circuit DLYR4 is input to the delay circuit DLYR5. The delay circuit DLYR5 outputs the column selection signal disabling timing signal TRYSD and the predecoding disabling timing signal TRPDD after delay time tpr5 controlled by the delay control circuit for a column cycle CCDC like the delay circuits DLYR3, DLYR4.

Next, the output of the delay circuit DLYR5 is input to the delay circuit DLYR6. The delay circuit DLYR6 outputs the MIO equalization enabling timing signal TRIOEQE after delay time tpr6 controlled by the delay control circuit for a column cycle CCDC like the delay circuits DLYR3, DLYR4, DLYR5. Next, the output of the delay circuit DLYR6 is input to the delay circuit DLYR7. The delay circuit DLYR7 outputs the read data latch timing signal TRDE after delay time tpr7 controlled by the delay control circuit for access time ATDC like the delay circuits DLYR1, DLYR2. Next, the output of the delay circuit DLYR7 is input to the delay circuit DLYR8. The delay circuit DLYR8 outputs the output enabling signal TDQB_U after delay time tpr8 controlled by the delay control circuit for access time ATDC like the delay circuits DLYR1, DLYR2, DLYR7.

Next, the output of the delay circuit DLYR8 is input to the delay circuit DLYR9. The delay circuit DLYR9 outputs the output enabling signal TDQB_U after delay time tpr9 controlled by the delay control circuit for access time ATDC like the delay circuits DLYR1, DLYR2, DLYR7, DLYR8. Next, the output of the delay circuit DLYR9 is input to the delay circuit DLYR10. The delay circuit DLYR10 outputs the output enabling signal TDQB_L after delay time tpr10 (tCK/2) controlled by the delay control circuit for a column cycle CCDC like the delay circuits DLYR3, DLYR4, DLYR5, DLYR6.

In this case, the column operation of the array is performed in time since the column selection signal YS is selected until the equalization of MIO is completed and the time is equivalent to the double of clock cycle time in DDR2 SDRAM. In the meantime, the access time is equivalent to time since a column command is input until first data is output to an input-output pin DQ and is represented by a product of column latency and clock cycle time.

Figure 4:
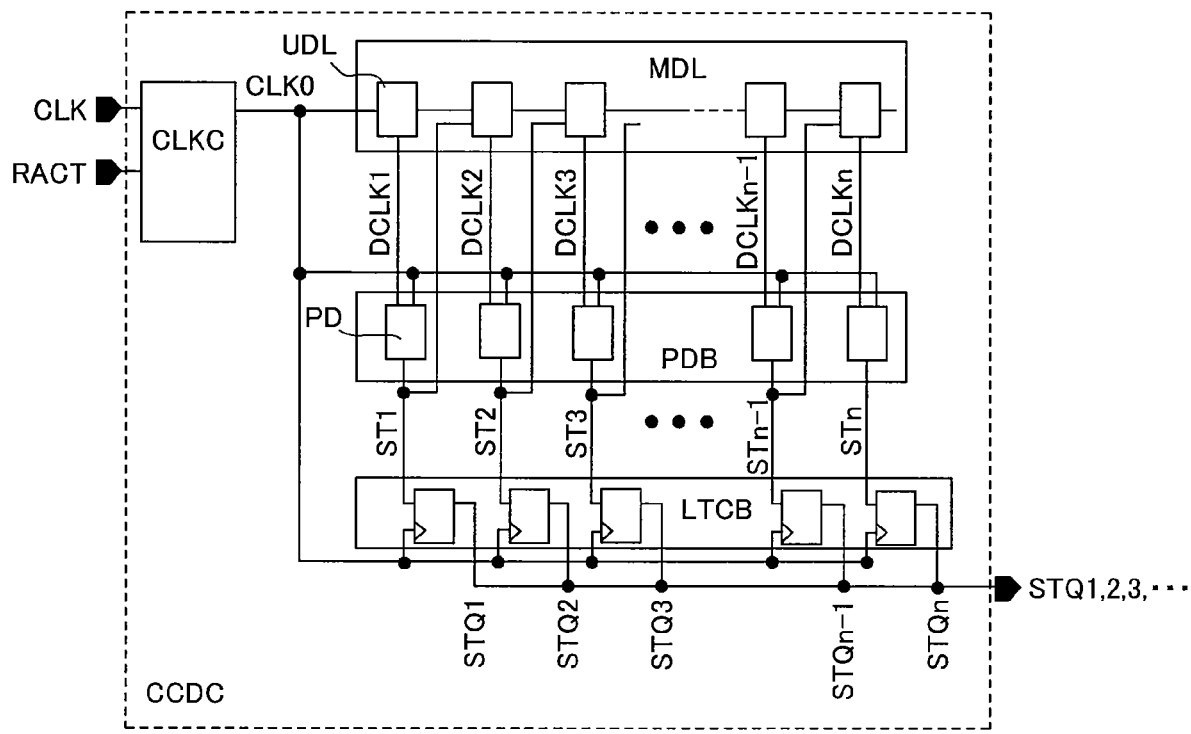
FIG. 4 shows an example of the configuration of a delay control circuit for a column cycle.
Figure 5A:
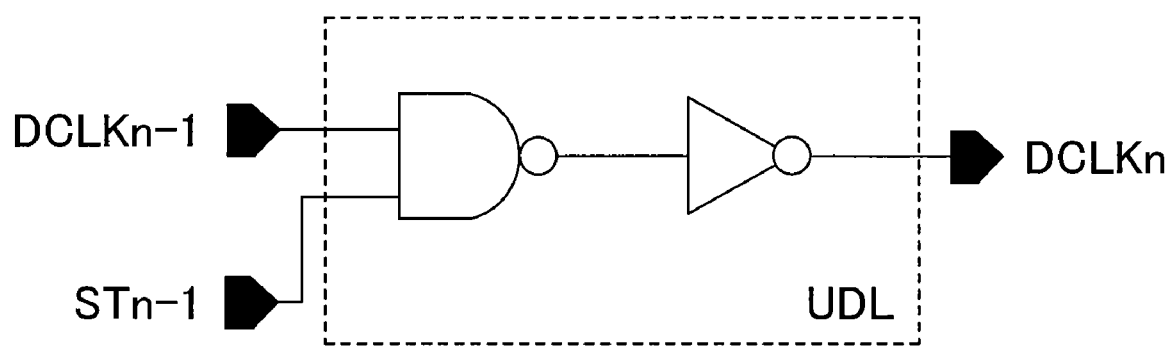
FIGS. 5A and 5B show examples of the configuration of a unit delay element and a phase comparator.
Figure 5B:
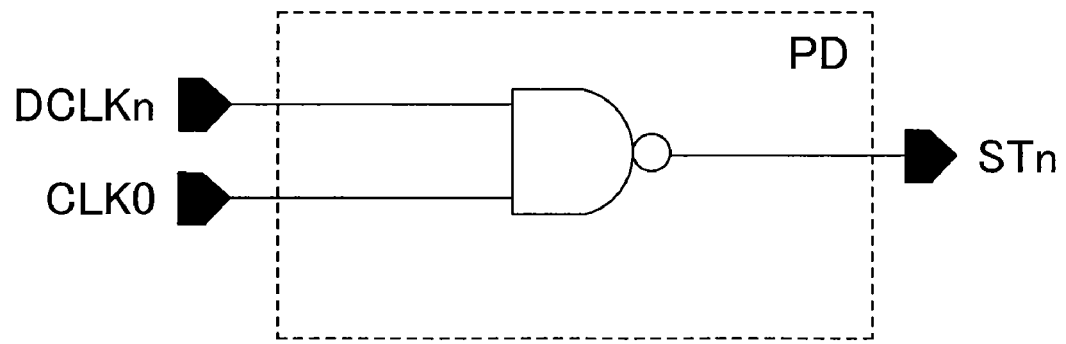

Next, the delay control circuit for a column cycle CCDC for controlling the delay time of the delay circuits DLYR3, DLYR4, DLYR5, DLYR6 respectively shown in FIG. 1 will be described referring to FIG. 4. For this configuration, the configuration of a so-called synchronous mirror delay circuit is utilized to measure the number of unit delay elements UDL equivalent to clock cycle time. The delay control circuit for a column cycle CCDC includes a clock controller CLKC that controls an input clock CLK0, a circuit that measures the cycle time of an external clock CLK and a delay stage control signal generator DCSG that transmits each signal the number of which is equivalent to the number of stages as a result of measurement to each delay circuit. The circuit that measures cycle time is provided with delay stages MDL including plural unit delay elements UDL and a phase comparing circuit PDB including plural phase comparators PD that compare the outputs DCLKn of delay stages and an undelayed clock CLK0. FIG. 5A shows the unit delay element UDL and FIG. 5B shows an example of the circuit configuration of the phase comparator PD.

The operation of this circuit will be described below. The clock controller is a circuit that generates a clock CLK0 input to the delay stage MDL and each phase comparator PD based upon an external clock. When a row activating command of DRAM is input to this circuit, a row act signal RACT is input to it and this circuit outputs an input clock CLK0 based upon an external clock. The input clock CLK0 is controlled by the clock controller CLKC so that only two pulses are output referring to the row act signal RACT. When the succeeding measurement operation is finished, the input clock CLK0 is stopped by a stop signal STP. The input clock CLK0 output from the clock controller is input to the delay stage MDL and each phase comparator PD. A clock DCLK0 acquired by delaying a first pulse of the clock CLK0 transmitted in the unit delay elements UDL in the delay stages MDL by the number of the unit delay elements UDL is output. The delayed clock DCLKn and the input clock CLK0 are input to the corresponding phase comparator PD. In the phase comparator PD, a second pulse of the input clock CLK0 and the delayed clock DCLK are compared and when their phases are coincident, a flag of a coincidence signal STn is turned on. Hereby, the number of the unit delay elements UDL equivalent to the cycle time of the input clock can be measured. As the measurement operation is executed every time a row activating command is input, delay stages equivalent to clock cycle time not only corresponding to dispersion among processes but corresponding to the variation of temperature and voltage can be measured. As the next and succeeding unit delay elements UDL are not operated when the flag of the coincidence signal STn is turned on, the power consumption can be reduced. In a latch block LTCB, a generally used D-flip flop latches a state of the coincidence signal STn and outputs a coincidence signal STQ using the input clock CLK0 as a trigger.

Next, a method of controlling the delay of the delay circuits DLYR3 to DLYR6 utilizing the coincidence signal STQ showing the number N of the unit delay elements for clock cycle time tCK will be described. Each delay circuit DLYR3 to DLYR6 is characterized in that the sum of each delay and MIO equalized time is controlled to be two clocks which is a minimum command input cycle (tCCD) of DDR2 SDRAM. For example, for the equalized time of MIO, 0.5 tCK that can be also sufficiently equalized in high-speed operation is allocated, for target delays of the delay circuits DLYR3, DLYR4, DLYR5, DLYR6, tpr3 is set to 0.2 tCK, tpr4 is set to 0.9 tCK, tpr5 is set to 0.3 tCK, and tpr6 is set to 0.1 tCK. The number of stages required for the delay circuits DLYR3, DLYR4, DLYR5, DLYR6 is acquired by acquiring the number of stages equivalent to the above-mentioned constants 0.2, 0.9, 0.3, 0.1 from the coincidence signals STQ0, STQ1, STQ2, STQ3 corresponding to the number of delay stages required for tCK for the coincidence signals STQ0, STQ1, - - - , STQn output from the delay control circuit for a column cycle CCDC.

Figure 6:
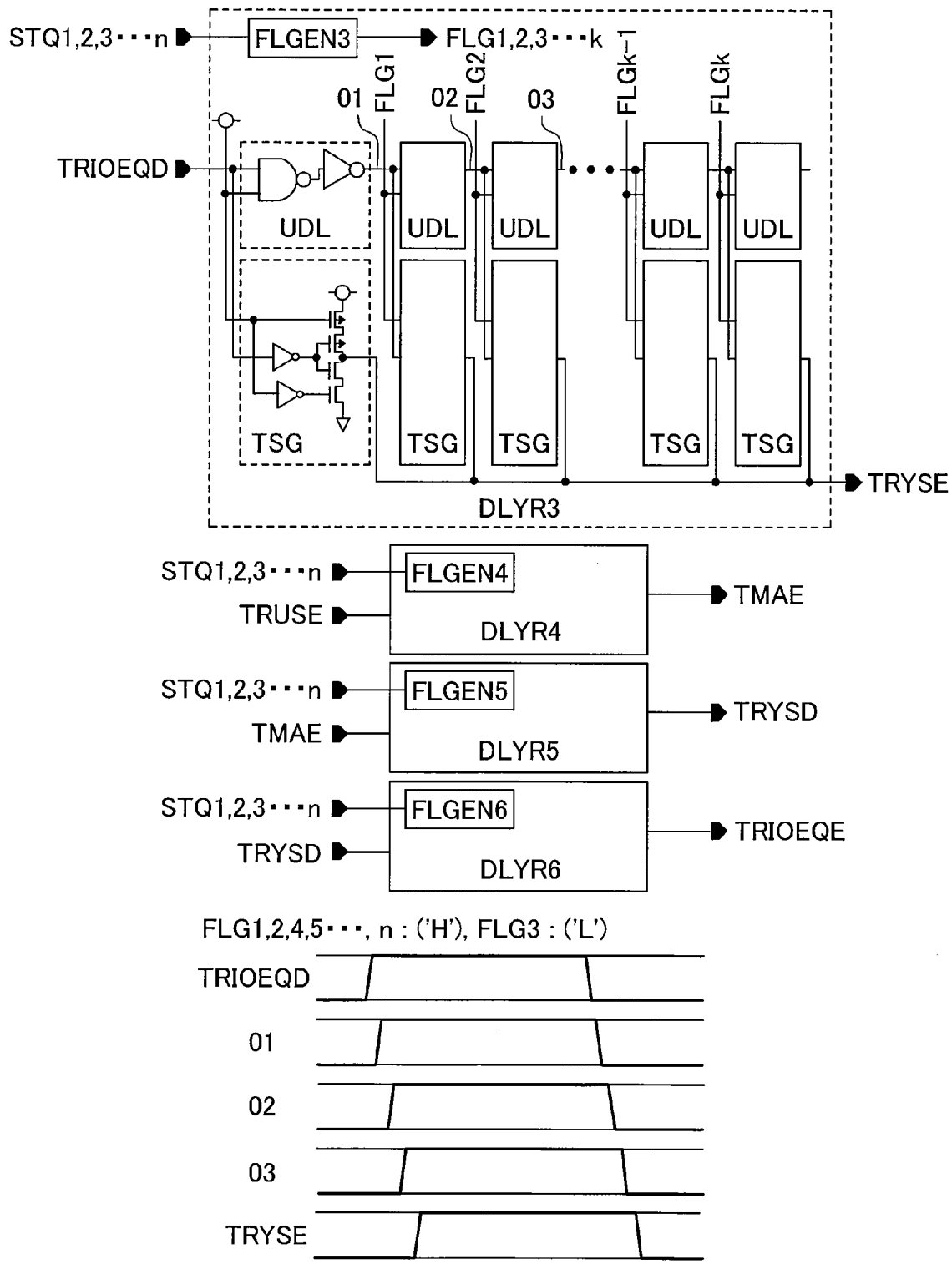
FIG. 6 shows an example of the configuration of a delay circuit.
Figure 7:
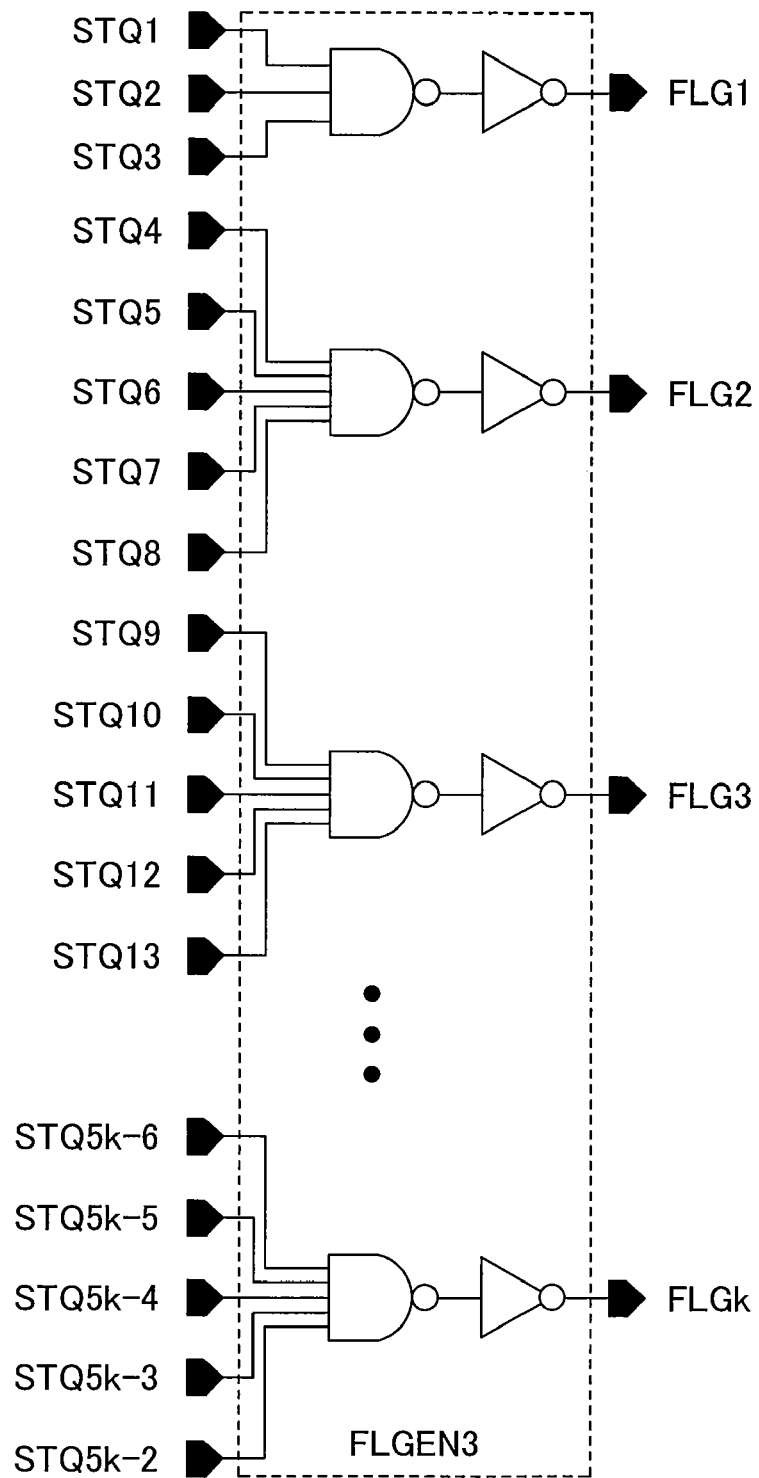
FIG. 7 shows an example of the configuration of a flag signal generating circuit.

Next, referring to FIG. 6, a stage number control method will be described using the delay circuit DLYR3 for an example. The delay circuit DLYR3 is set to delay time equivalent to 0.2 of clock cycle time tCK, that is, the number of stages equivalent to 20% of the number of stages for realizing tCK. Next, a method of setting it will be described. In the delay circuit DLYR3, the same unit delay elements UDL as the unit delay elements UDL used for the measuring delay sequence MDL are connected in series. Flag signals of flag signals FLG1, FLG2, - - - input to the respective unit delay elements UDL are input to delay stages used in the delay circuit DLYR3 and the output of the unit delay elements UDL is equivalent to the output of the delay circuit DLYR3. The flag signals FLG1, FLG2, FLG3, - - - for realizing a predetermined number of stages can be realized by circuit configuration like a flag generating circuit FLGEN3 shown in FIG. 7. In this case, as to stages equivalent to 20%, as flags are turned on at stages where coincidence signals STQ are coincident, the flag signal FLG1 is output by the logical product of STQ1, STQ2, STQ3 and the flag signal FLG2 is output by the logical product of STQ4 to STQ8.

Hereby, as the five unit delay elements UDL in the measuring delay sequence MDL can be replaced with one unit delay element UDL by allocating one flag signal every five coincidence signals STQ in the measuring delay sequence MDL, delay time equivalent to 20% of clock cycle time can be realized in the delay circuit DLYR3. In FIG. 6, operational waveforms when FLG3 is turned on are shown. Hereby, the number of stages required in the delay circuit DLYR3 can be set using the number of delay stages of clock cycle time tCK. As the number of stages where total delay time is tCK is measured corresponding to dispersion among processes, the variation of voltage and a temperature change by setting as described above beforehand and the flag signals are controlled using the result so that the number of required delay stages is equivalent to target delay time, timing signals are output in delay time of fixed times of clock cycle time and stable array cycle operation can be realized. The other delay circuits DLYR4, DLYR5, DLYR6 can be also realized by the similar configuration.

For example, in a flag generating circuit FLGEN4 arranged inside the delay circuit DLYR4, one flag signal has only to be allocated to eleven coincidence signals STQ to realize delay time of 90% for the delay circuit DLYR4. The other delay circuits can be also similarly configured. Hereby, not only the number of delay stages is controlled even if a clock frequency varies but operation resistant to the variation of temperature, processes and voltage is enabled.

Figure 8:
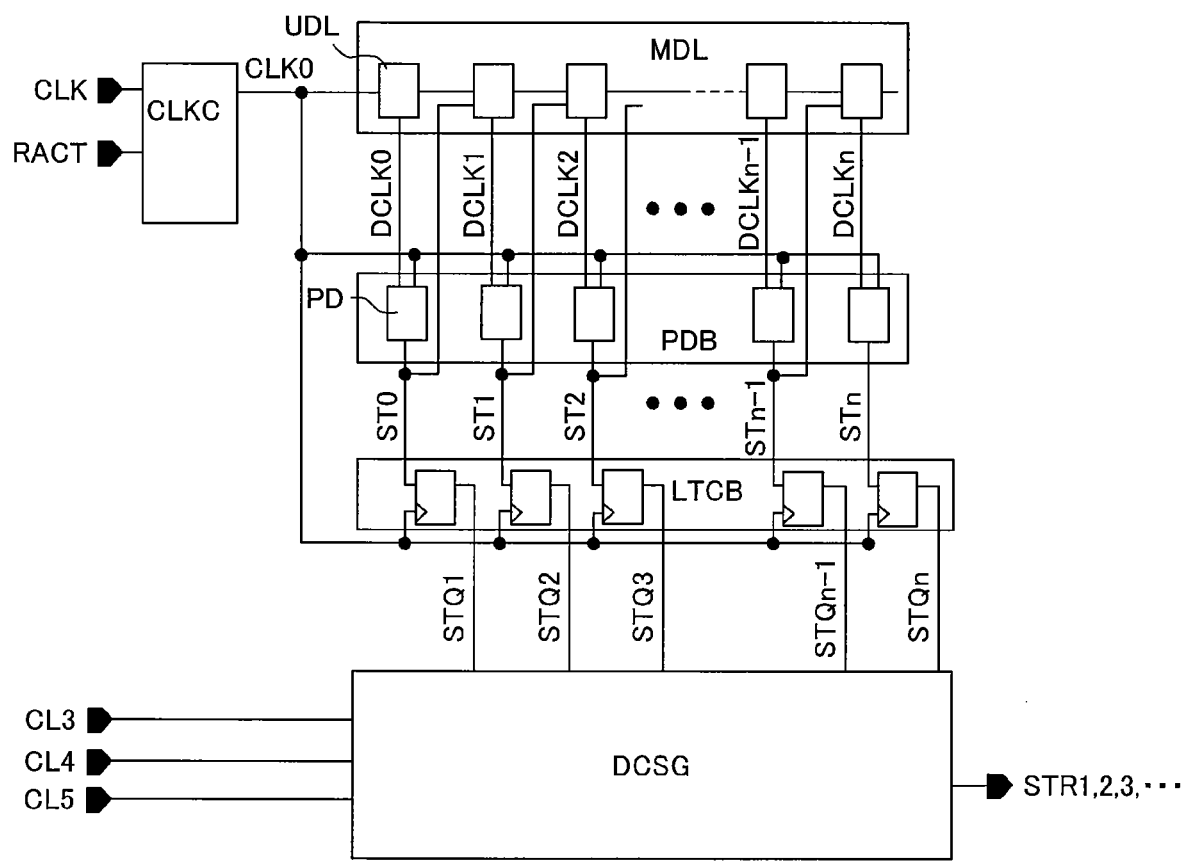
FIG. 8 shows an example of the configuration of a delay circuit.

Next, referring to FIG. 8, the delay control circuit for access time ATDC for controlling the delay of the delay circuits DLYR1, DLYR2, DLYR7, DLYR8, DLYR9 shown in FIG. 1 will be described. Measuring delay stages MDL, a phase comparing block PDB and a latch block LTCB in this circuit configuration are similar to those of the above-mentioned delay control circuit for a column cycle CCDC. Therefore, the delay control circuit for a column cycle CCDC may be also used. Thereby, as not only chip area can be reduced but the number of operating circuits can be reduced, there is an advantage that power consumption can be reduced. Besides, as an effect of dispersion in operation among plural circuits can be removed, there is also an advantage that dispersion in operational timing can be reduced. In the delay control circuit for access time ATDC, a delay stage signal control circuit DCSG is arranged differently from the delay control circuit for a column cycle CCDC.

Figure 9:
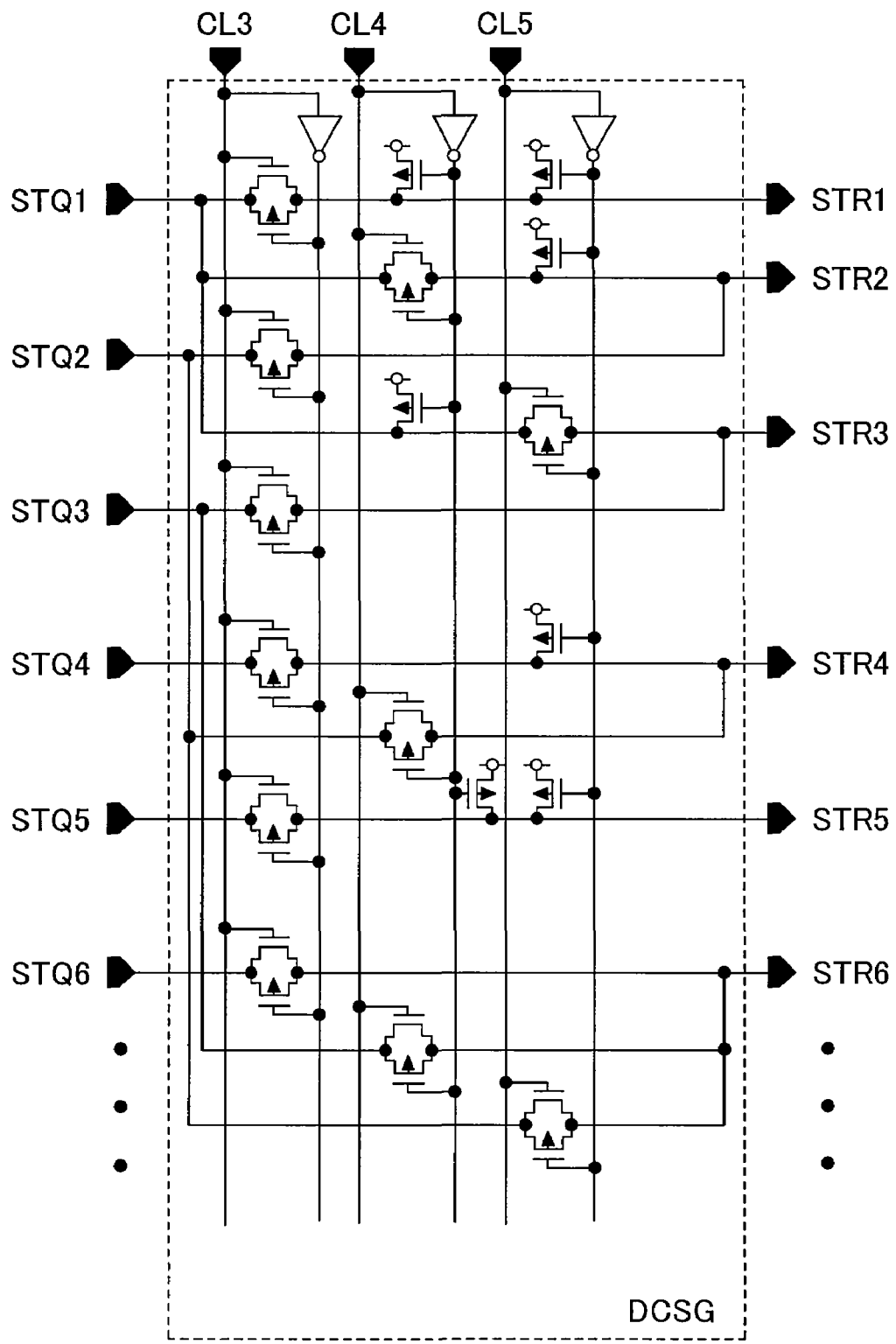
FIG. 9 shows an example of the configuration of a delay stage control signal generating circuit.

FIG. 9 shows an example of the circuit configuration of the delay stage signal control circuit DCSG. This circuit is a circuit that generates delay stage number control signals STR1, STR2, STR3, - - - from coincidence signals STQ1, STQ2, STQ3, . . . according to a column latency 3 flag signal CL3 selected when CL is 3, a column latency 4 flag signal CL4 and a column latency 5 flag signal CL5 according to a value of column latency CL stored in a mode register MR. Concretely, in the case of CL3, connection is made so that STR1 is generated from STQ1, - - - and in the case of CL4, connection is made so that STR2 is generated from STQ1, STR4 is generated from STQ2, - - - and STR2$k$ is generated from STQk. Similarly, in the case of CL5, connection is made so that STR3 is generated from STQ1, STR6 is generated from STQ2, - - - and STR3$k$ is generated from STQk. To prevent STRk from floating, when no coincidence signal STQ connected in selected column latency exists, a signal is input to PMOS at a high level. Next, target delays of delay circuits DLYR1, DLYR2, DLYR7, DLYR8, DLYR9 are set to be fixed times of time acquired by subtracting column cycle time 2tCK from the product of column latency CL and tCK. For example, a case that the ratio of the delay of the delay circuits DLYR1, DLYR2, DLYR7, DLYR8, DLYR9 is 0.25: 0.25: 0.125: 0.125: 0.25 will be described below.

Figure 10:
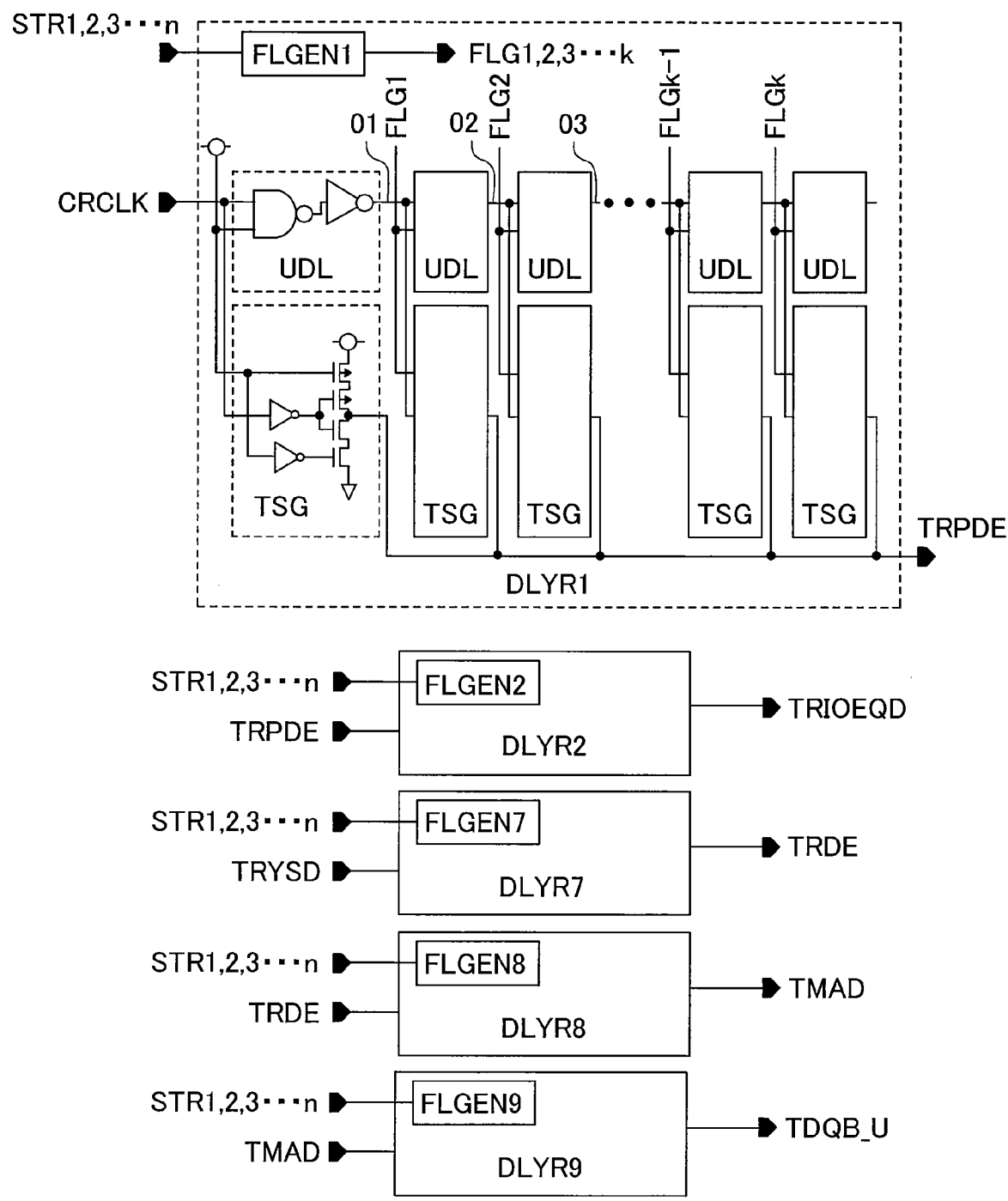
FIG. 10 shows an example of the configuration of a delay circuit.
Figure 11:
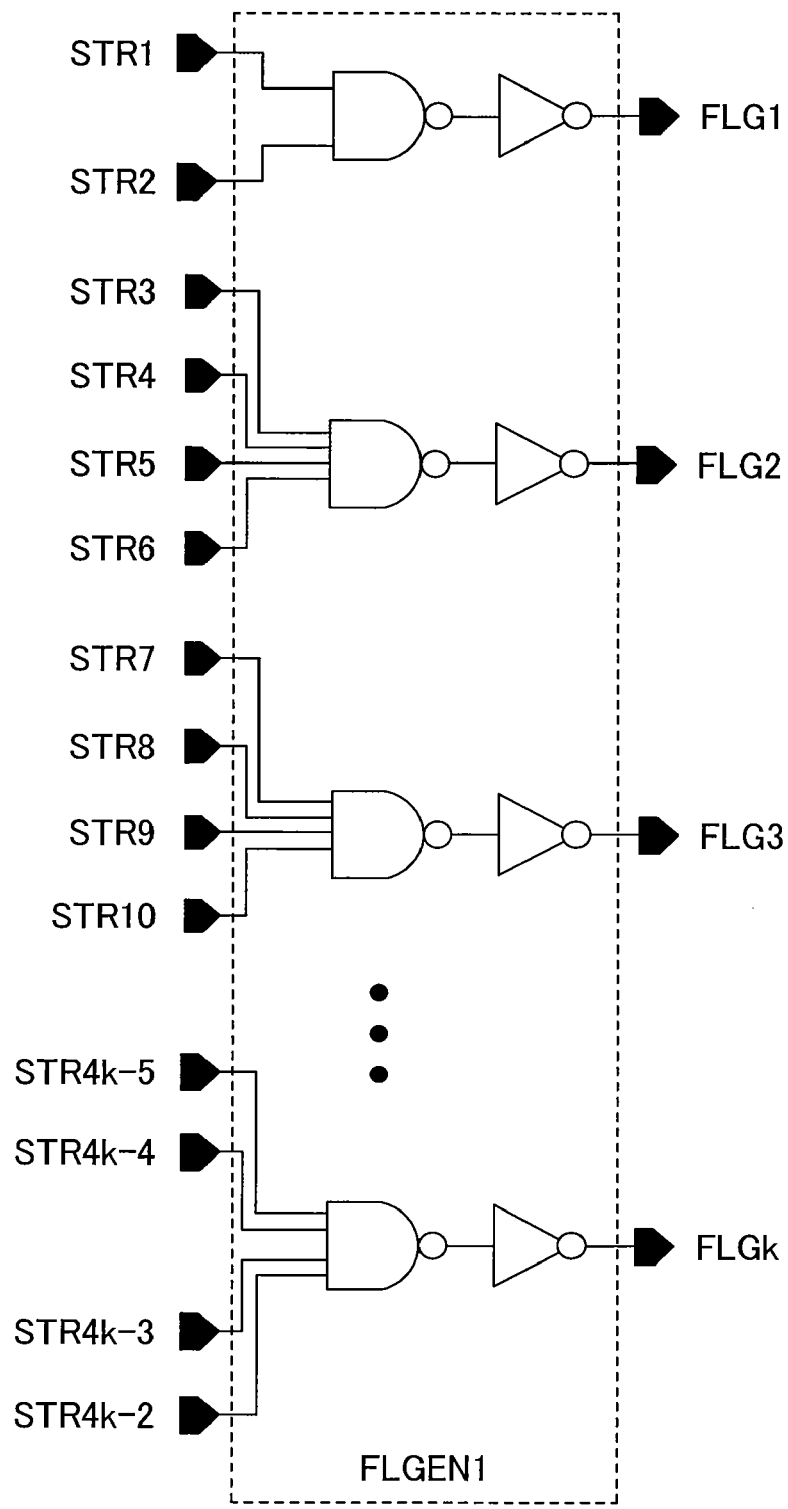
FIG. 11 shows an example of the configuration of a flag signal generating circuit.

FIG. 10 shows the configuration of the delay circuit DLYR1. The delay circuit DLYR1 is set to delay time equivalent to 0.25 of time equivalent to the product of a value acquired by subtracting 2 from column latency CL and clock cycle time tCK. Next, the setting method will be described. In the delay circuit DLYR1, the same unit delay elements UDL as the unit delay elements UDL used in the delay stages MDL are connected in series. Flag signals FLG0, FLG1, FLG2, - - - input to the respective unit delay elements are turned on at delay stages used in the delay circuit DLYR1 and the output of the unit delay elements UDL is the output of the delay circuit DLYR1. The flag signals FLG1, FLG2, FLG3, - - - for realizing the stages can be realized by circuit configuration shown in FIG. 11. In this case, as to stages equivalent to 25%, as flags are turned on at stages where coincidence signals STR are coincident, ¼ of time equivalent to the product of delay time measured by the delay control circuit for access time ATDC and time acquired by subtracting 2 from column latency CL is realized by generating the flag signal FLG1 by the logical product of STR1 and STR2 and generating the flag signal FLG2 by the logical product of STR3 to STR6. Hereby, the number of stages required for the delay circuit DLYR1 can be set using the number of delay stages in clock cycle time tCK and a value of column latency.

As the number of required delay stages varies to be target delay time corresponding to dispersion among processes, the variation of voltage and a temperature change by setting as described above, timing signals are output in delay time equivalent to fixed times of clock cycle time and stable array cycle operation can be realized. The other delay circuits DLYR2, DLYR7, DLYR8, DLYR9 can be also realized by the similar configuration.

A clock measuring unit that measures a delay equivalent to clock cycle time tCK may be also shared with the delay control circuit for a column cycle CCDC. In that case, there is an advantage that not only chip area can be reduced because the number of circuits can be reduced but power consumption can be reduced because the number of operated circuits can be reduced.

Figure 12:
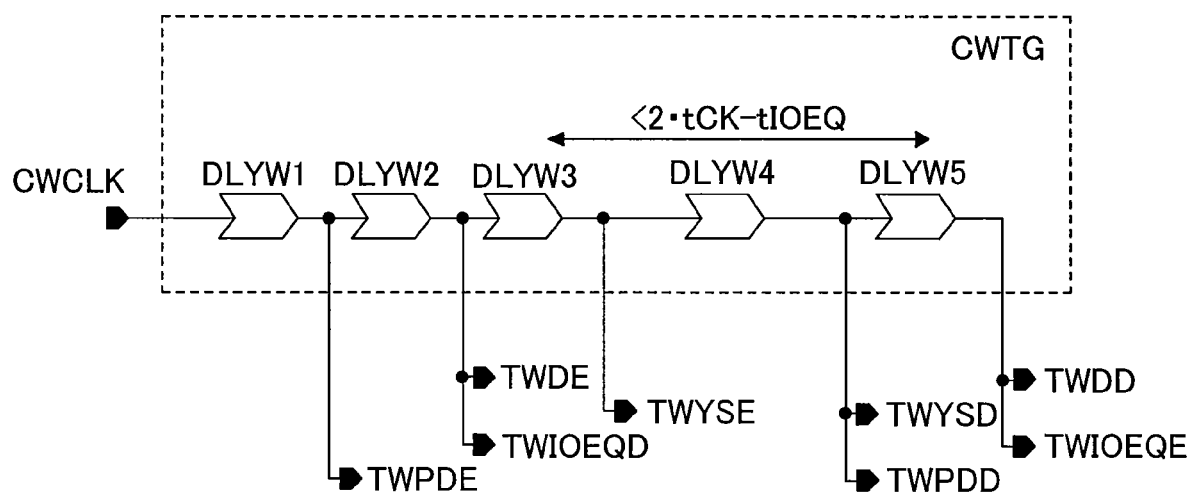
FIG. 12 shows an example of the configuration of a column write timing signal generating circuit.

Next, referring to FIG. 12, the column write timing control circuit CWTG of the column timing control circuit CTGB will be described. Delay circuits DLYW1, - - - , DLYW5 configure a delay circuit block that realizes desired delay time. The delay circuit block is controlled by the delay control circuit for a column cycle CCDC so that the sum of the delay time of the delay circuits DLYW3, DLYW4, DLYW5 that output a column selection enabling timing signal TWYSE to an MIO equalization enabling timing signal TWIOEQE respectively required to be operated in a command input cycle, that is, in a column operation cycle out of DLYW1 to DLYW5 is equivalent to a result of "the column operation cycle—MIO equalization time (tIOEQ)".

In this case, based upon a column write clock CWCLK generated when a command is input from an external device, there are output a write data enabling signal TWE for transferring input data to a write driver, a predecoding enabling timing signal TWPDE for initiating the predecoding of an input address, a predecoding disabling timing signal TWPDD for resetting the output of a predecoder, a timing signal TWIOEQD for stopping the equalization of the data I/O line MIO of the read array, an MIO equalization enabling timing signal TWIOEQE for initiating the equalization of the data I/O line MIO, a column selection signal enabling timing signal TWYSE for activating a column selection signal YS corresponding to the input address, a column selection signal disabling timing signal TWYSD, a write amplifier activating timing signal TWDE for activating a write amplifier WD that writes write data to the data I/O line MIO and a write amplifier disabling timing signal TWDD for inactivating the write amplifier.

Figure 13:
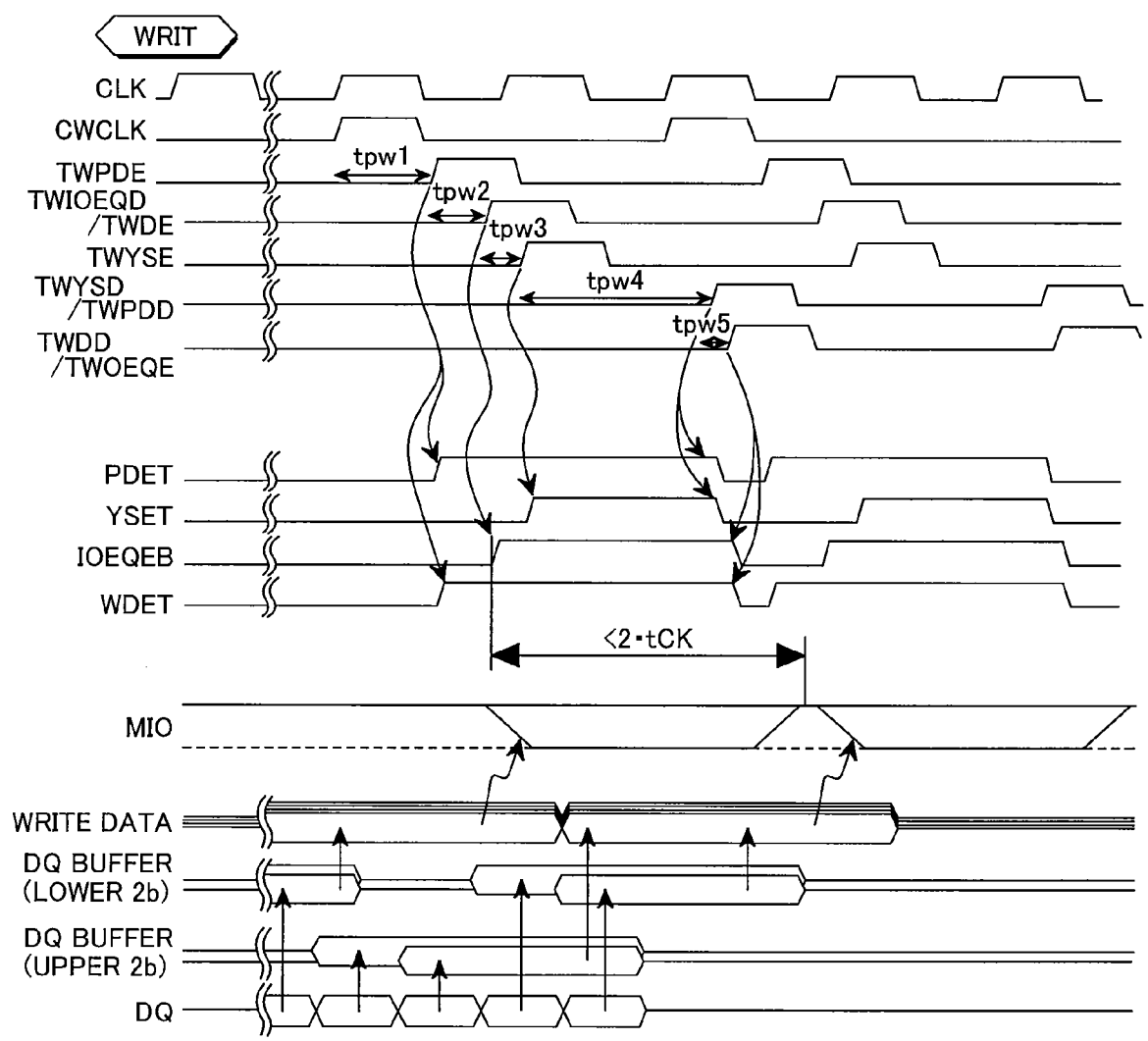
FIG. 13 shows an example of operational waveforms of the column write timing signal generating circuit.

Next, FIG. 13 shows operational timing waveforms. In FIG. 13, the waveforms when 4-bit burst write operation is continuously executed twice according to the write command (WRIT) are shown. After a predetermined number of clocks from an edge of an external clock CLK when the write command is input, the column write clock CWCLK is generated and is input to the delay circuit DLYW1. The delay circuit DLYWL outputs the column predecoding enabling timing signal TWPDE after delay time tpw1 controlled by the delay control circuit for access time ATDC. Next, the output of the delay circuit DLYWL is input to the delay circuit DLYW2. The delay circuit DLYW2 outputs the MIO equalization dis-abling timing signal TWIOEQD and the write driver enabling timing signal TWDE after delay time tpw2 controlled by the delay control circuit for access time ATDC like the delay circuit DLYW1. Next, the output of the delay circuit DLYW2 is input to the delay circuit DLYW3. The delay circuit DLYW3 outputs the column selection signal enabling timing signal TWYSE after delay time tpw3 controlled by the delay control circuit for a column cycle CCDC.

Next, the output of the delay circuit DLYW3 is input to the delay circuit DLYW4. The delay circuit DLYW4 outputs the column selection signal disabling timing signal TWYSD and the predecoding disabling timing signal TWPDD after delay time tpw4 controlled by the delay control circuit for a column cycle CCDC. Next, the output of the delay circuit DLYW4 is input to the delay circuit DLYW5. The delay circuit DLYW5 outputs the MIO equalization enabling timing signal TWIOEQE and the write driver disabling signal TWDD after delay time tpw5 controlled by the delay control circuit for a column cycle CCDC like the delay circuits DLYW3 and DLYW4.

Figure 14A:
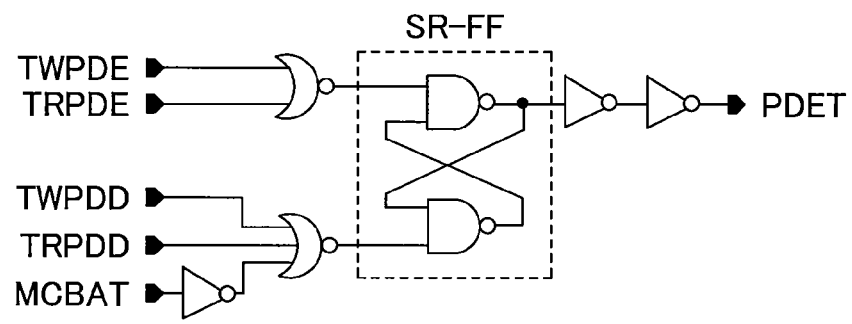
FIGS. 14A, 14B, and 14C show an example of the configuration of a predecoding timing signal generating circuit and operational waveforms.

Next, the operation of a circuit that uses timing signals respectively output by the column read timing generating circuit CRTG and the column write timing generating circuit CWTG will be described. FIG. 14A shows an embodiment of a circuit block that generates a signal PDET for activating a predecoding circuit. The circuit block generates the predecoding enabling signal PDET from the predecoding enabling timing signals TRPDE, TWPDE and the predecoding disabling timing signals TRPDD, TWPDD.

Figure 14B:
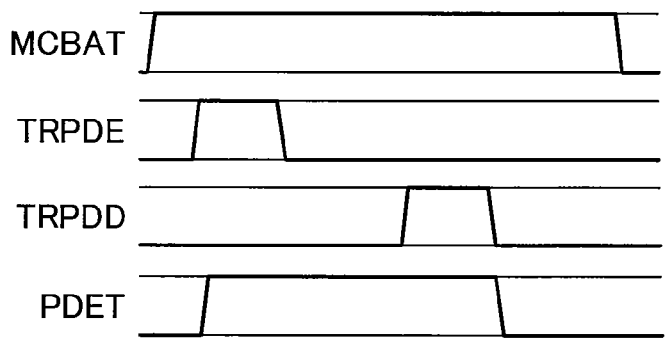
Figure 14C:

FIG. 14B shows waveforms of read operation and FIG. 14C shows waveforms of write operation. As shown in FIG. 14B, as a flag of a bank selection signal MCBAT is on standby, a flag of the predecoding enabling signal PDET is on. When a row command is input and the corresponding memory bank is activated, the flag of the bank selection signal MCBAT is turned off and an SR flip-flop including two NANDs is reset. Afterward, when a column command is input and a flag of the predecoding enabling timing signal TRPDE is turned off by the column read timing control circuit CRTG, the SR flip-flop is set and the flag of the predecoding enabling signal PDET is turned off. Afterward, even if the flag of the predecoding enabling timing signal TRPDE is turned on, the SR flip-flop is kept in an output state. Next, as the SR flip-flop is reset when the flag of the predecoding disabling timing signal TRPDD is turned off from the on state, the predecoding enabling signal PDET is inactivated. The write operation is similar.

Figure 15A:
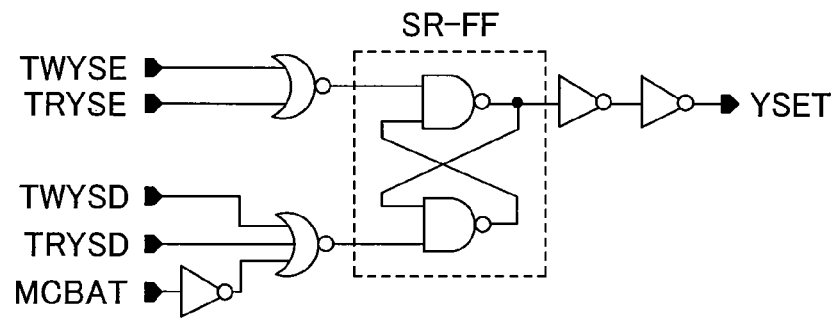
FIGS. 15A, 15B, and 15C show an example of the configuration of a column selection enabling signal generating circuit and operational waveforms.
Figure 15B:
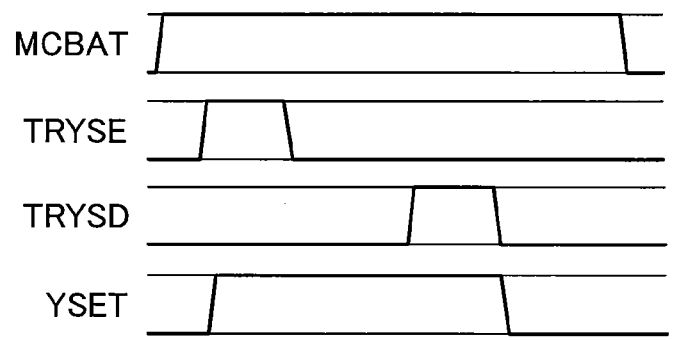
Figure 15C:

Similarly, FIG. 15A shows a circuit for generating a column selection enabling signal YSET. FIG. 15B shows waveforms of read operation and FIG. 15C shows waveforms of write operation. An operational principle is similar to that of the predecoding enabling signal PDET.

Figure 16A:
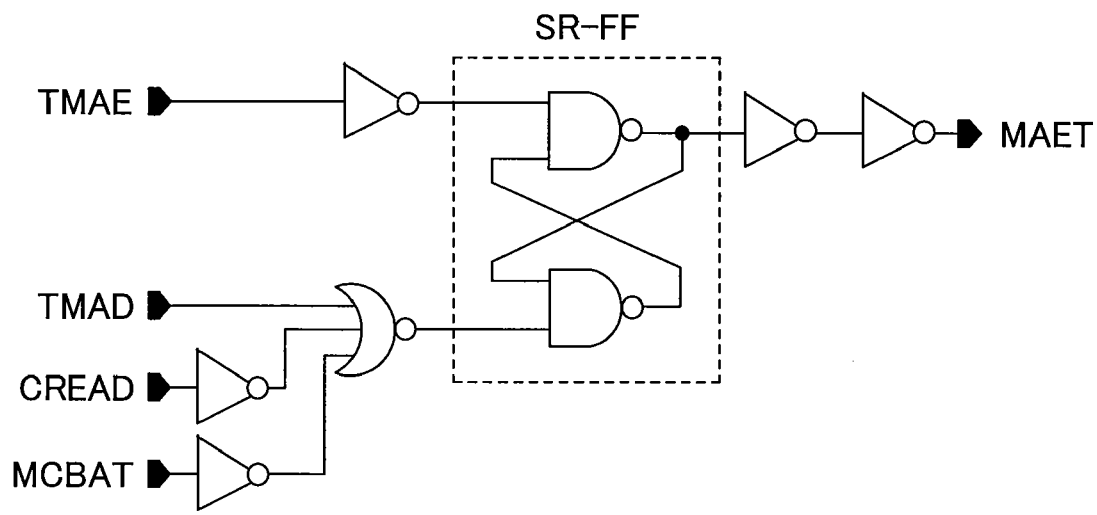
FIGS. 16A and 16B show an example of the configuration of a main amplifier activating signal generating circuit and operational waveforms.
Figure 16B:
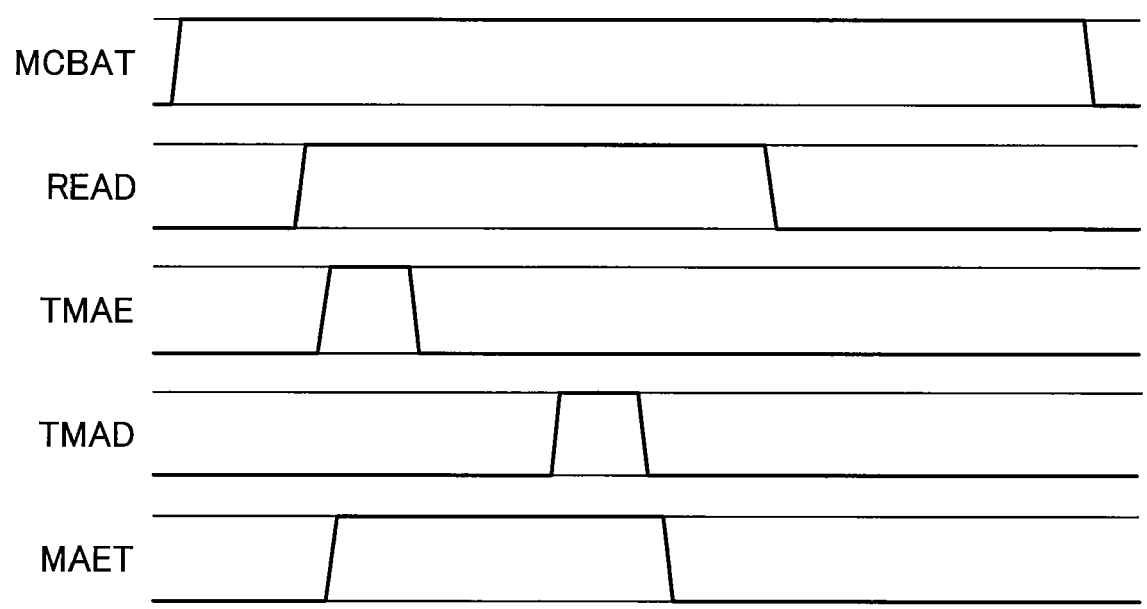

Further, FIG. 16A shows a circuit for generating a main amplifier activating signal MAET. FIG. 16B shows circuit operation waveforms. The operation of the circuit will be described below. This configuration is different in the configuration of a signal for resetting an SR flip-flop from the configuration for generating the predecoding enabling signal PDET and the configuration for generating the column selection enabling signal YSET. This configuration is characterized in that when a read command is input to operate this circuit, the main amplifier disabling timing signal TMAD, an inverted signal of the bank selection signal MCBAT and an inverted signal of a read command signal CREAD are NORed to operate this circuit. Hereby, the main amplifier activating signal MAET is controlled to be output only at the time of the read command.

Figure 17A:
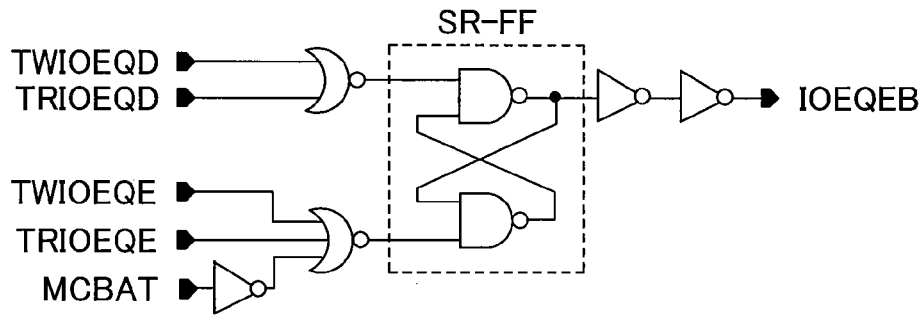
FIGS. 17A, 17B, and 17C show an example of the configuration of an MIO equalization signal generating circuit and operational waveforms.
Figure 17B:
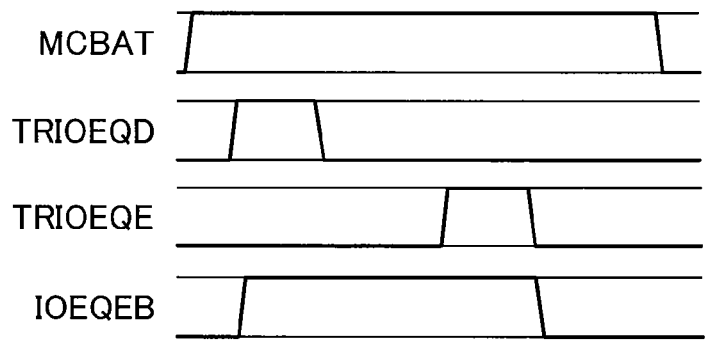
Figure 17C:
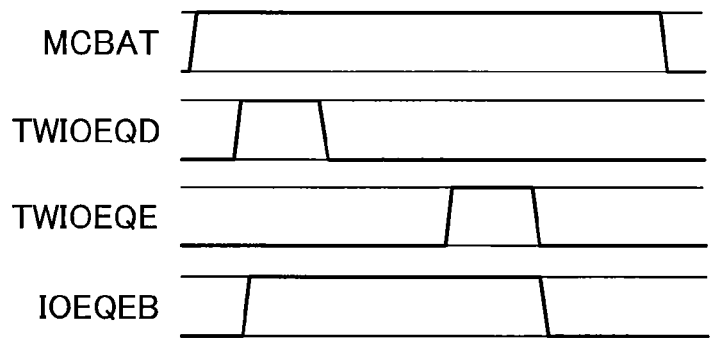

Next, FIG. 17A shows a circuit for generating a main I/O equalization signal IOEQEB. FIG. 17B shows waveforms of read operation and FIG. 17C shows waveforms of write operation. An operational principle is similar to those of the circuit for generating the column selection signal YSET and the circuit for generating the predecoding enabling signal PDET.

Figure 18A:
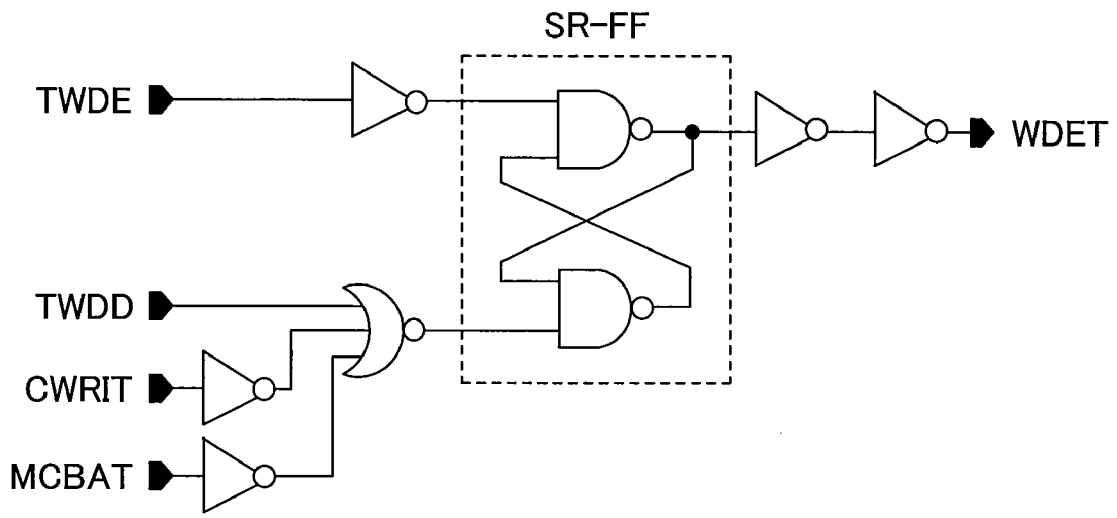
FIGS. 18A and 18B show an example of the configuration of a write amplifier activating signal generating circuit and operational waveforms.
Figure 18B:
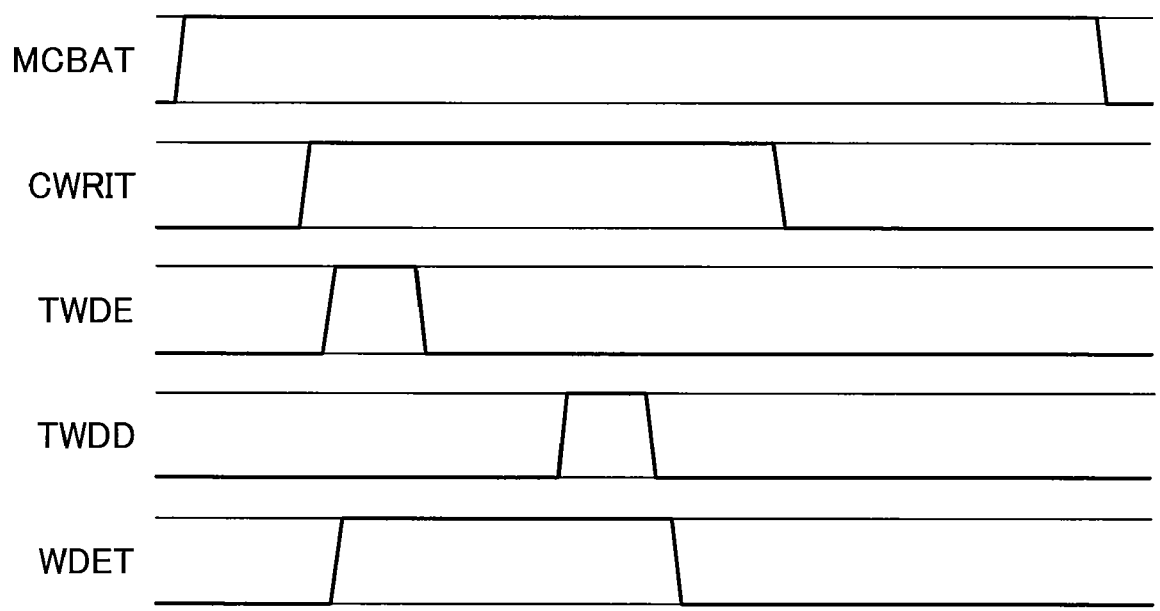

Next, FIG. 18A shows a circuit for generating a write amplifier activating signal WDET. FIG. 18B shows waveforms of circuit operation. The operation of the circuit will be described below. This configuration is similar to that of the circuit for generating the main amplifier activating signal MAET though the write amplifier activating signal WDET is different from the main amplifier activating signal MAET. This configuration is characterized in that when a write command WRIT is input to operate this circuit, the write amplifier disabling timing signal TWDD, an inverted signal of the bank selection signal MCBAT and an inverted signal of a write command signal CWRIT are NORed to operate this circuit. Hereby, the write amplifier activating signal WDET is controlled to be output only at the time of a write command.

Figure 19:
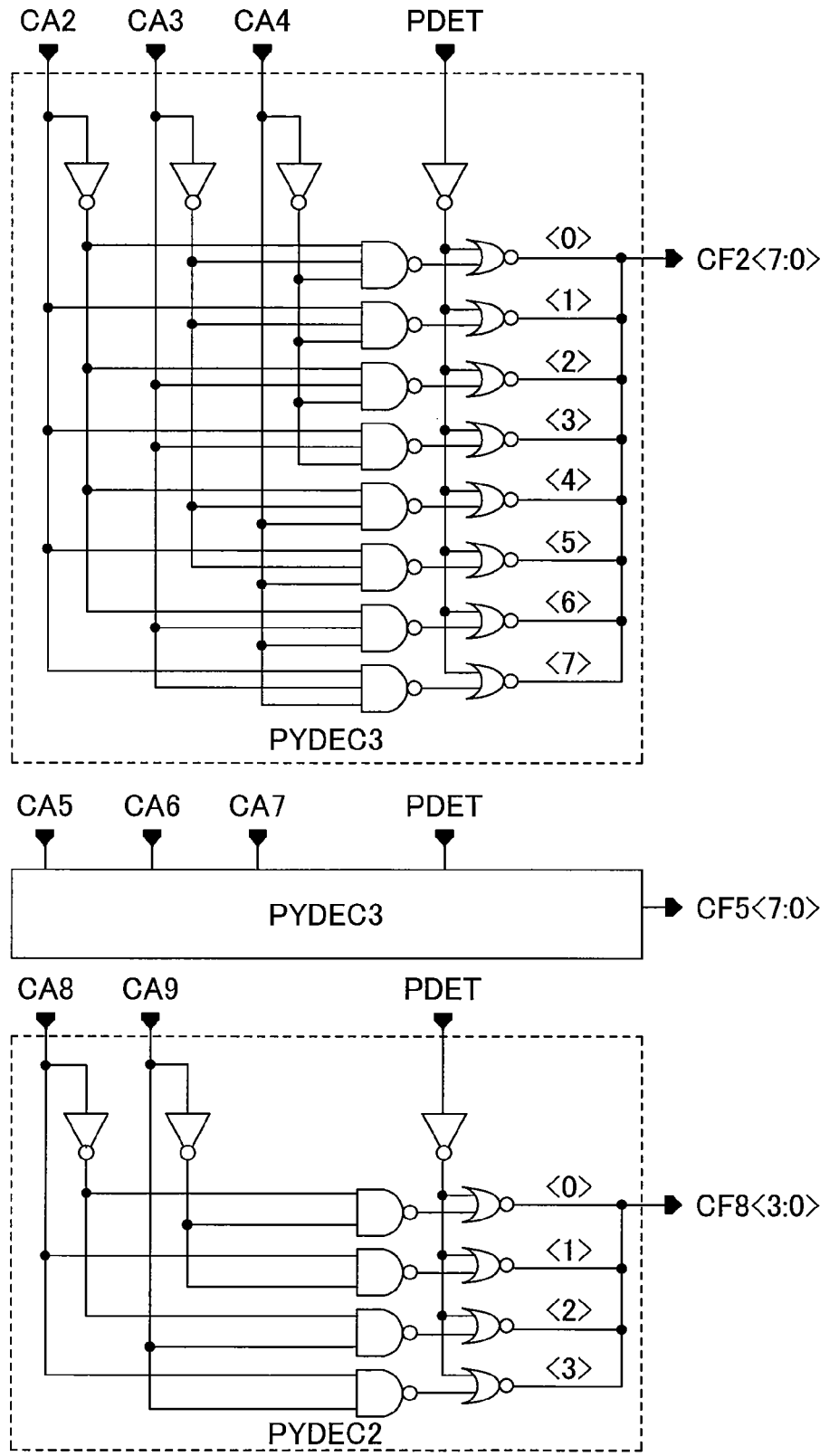
FIG. 19 shows an example of the configuration of a column predecoder.

Next, the operation of the predecoder that uses the predecoding enabling signal PDET will be described. FIG. 19 shows one example of the predecoder for generating predecoding signals CF2, CF5, CF8 from an input address AY. In this example, a 3-bit predecoder that generates eight predecoding signals from a 3-bit input address is shown. In FIG. 19, a 2-bit predecoder that generates four predecoding signals from a 2-bit input address is also shown. Normally, one of the eight predecoding signals based upon the input address is activated by predecoding in the 3-bit predecoder and one of the four predecoding signals is activated in the 2-bit predecoder.

Figure 20:
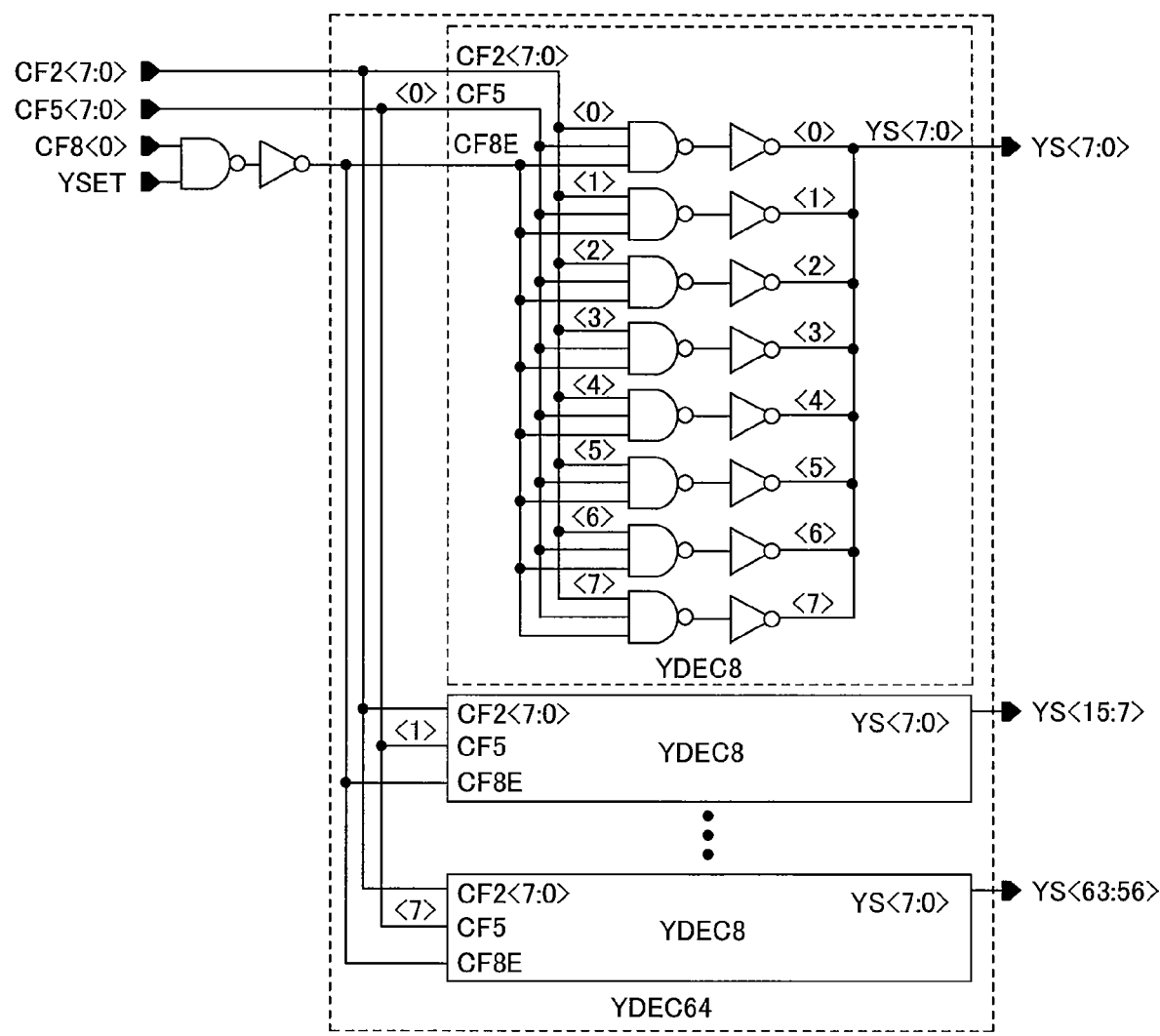
FIG. 20 shows an example of the configuration of a column decoder.

Next, the operation of a column decoder that uses the column selection enabling signal YSET will be described. FIG. 20 shows one example of the column decoder for selecting the column selection signal YS out of the predecoding signals output from the predecoder. The column selection signal YS is selected by the logical product of the three predecoding signals CF - - - . Normally, one column selection signal YS is selected in a predetermined block corresponding to the predecoding signal.

Figure 21:
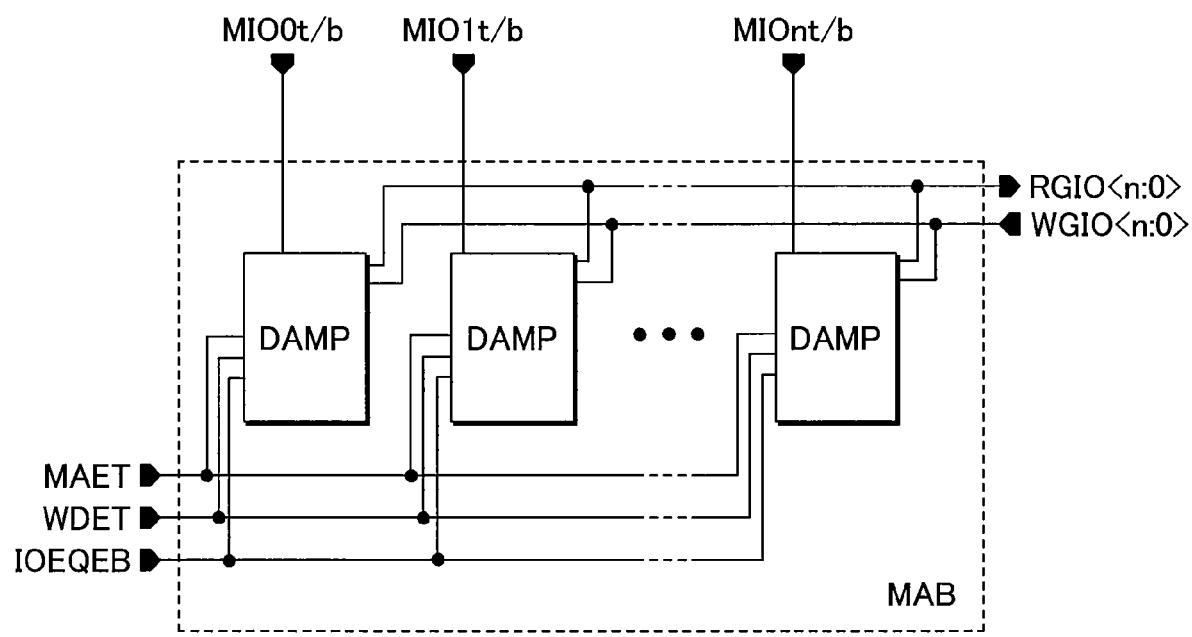
FIG. 21 shows an example of the configuration of a main amplifier block.
Figure 22:
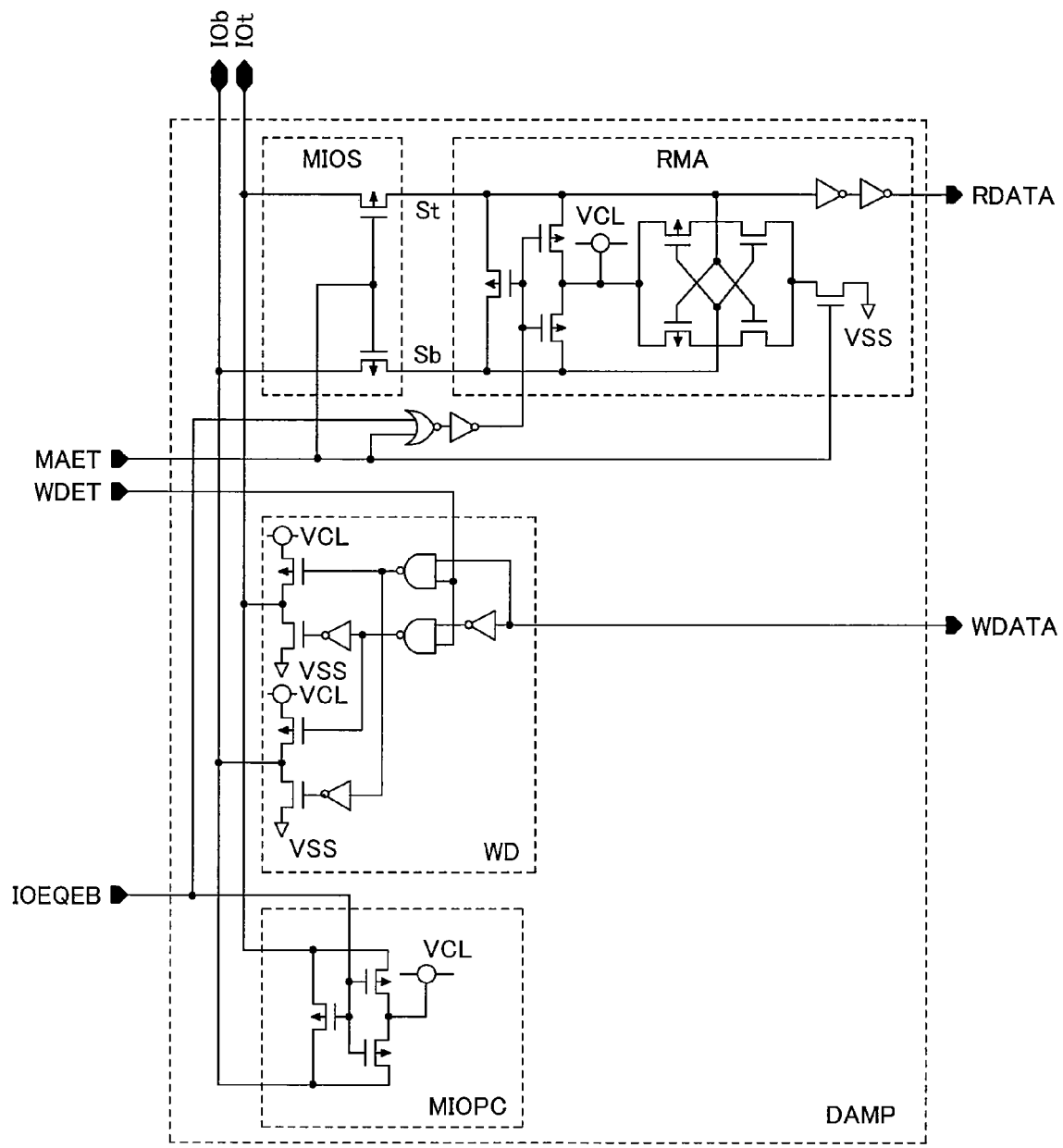
FIG. 22 shows an example of the configuration of a main amplifier and a write driver.

Next, the configuration and the operation of a main amplifier block that uses the main amplifier activating signal MAET and the MIO equalization signal IOEQEB will be described. FIG. 21 is a block diagram showing data amplifiers for reading data in each sense amplifier selected on a column selecting line and a write driver for transmitting write data from an external device to the sense amplifier. FIG. 22 shows one example of the data amplifier for reading data in a sense amplifier selected on a column selecting line and a write driver for transmitting write data from an external device to the sense amplifier. The data amplifier is controlled by a cross-coupled amplifier activated by a data amplifier activating signal and a data amplifier equalization signal for setting a node in the data amplifier to a desired voltage level on standby. Besides, a main I/O precharge circuit controlled by the main I/O equalization signal for precharging the main I/O line which is a data transfer path from the sense amplifier to the data amplifier to a desired voltage level on standby is arranged.

Figure 23A:
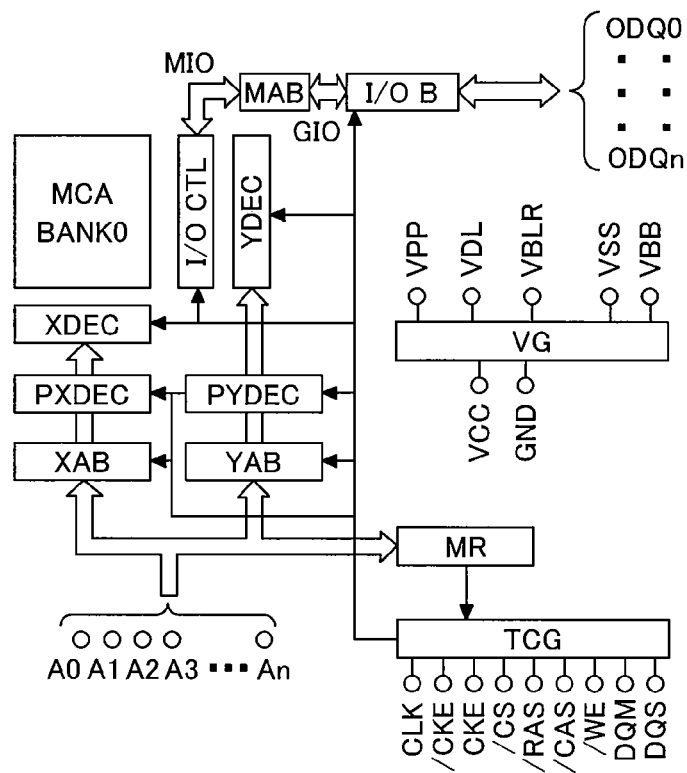
FIG. 23A is a block diagram showing DDR2 SDRAM and FIG. 23B shows an example of the configuration of a memory bank.

Next, the configuration of DDR2 SDRAM to which the column timing control circuit CTGB is applied will be described. FIGS. 23 show the whole block of the DDR2 SDRAM. In addition, the column timing control circuit can be also applied to SDRAM, DDR SDRAM and DDR3 SDRAM. Each circuit in the chip is operated at the timing of an internal control signal generated in a timing signal generating circuit TCG. The timing signal generating circuit TCG includes the column timing control circuit CTGB and a row timing control circuit. For a control signal input to the timing signal generating circuit TCG, there are a chip selection signal /CS, a row address strobe /RAS, a column address strobe /CAS and a write enabling signal /WE respectively input at the timing of a clock signal CLK. Besides, DDR2 SDRAM includes a mode register MR storing an operational mode of DRAM, for example, the number of clocks in column latency (CL), an output data format and a specified value of the number of clocks for write recovery utilizing an address pin. A specific value of the mode register, for example, column latency (CL) and the number of clocks for write recovery are also input to the timing signal generating circuit TCG.

The combination of an external signal, for example, a control signal such as the chip selection signal /CS, the row address strobe /RAS, the column address strobe /CAS and the write enabling signal /WE and an address signal is called a command. A clock enabling signal CKE determines whether a clock signal is valid or not. An I/O mask signal DQM is a signal for controlling a data I/O buffer I/OB to mask data input/output from I/O terminals (DQ0, - - - , DQn). A power generating circuit VG supplies a word line voltage boost level (VPP), substrate potential (VBB), array voltage (VDL) and peripheral circuit voltage (VCL) to the circuit. In SDRAM, a multiaddress system in which row addresses XA0, XA1, - - - , XAn and column addresses YA0, YA1, - - - YAn are input from address input terminals (A0, A1, - - - , An) in time division is adopted. Row addresses XA0, XA1, - - - , XAn input from the address input terminal to a row address buffer XAB are decoded in a row address decoder XDEC and a specific word line in one memory array (MA) is selected. According to it, a memory cell for one word is selected. Succeedingly, when a column address is input to a column address buffer YAB, a memory cell to be read/written is further selected by a column address decoder YDEC. SDRAM is normally provided with plural memory arrays (or plural memory banks) specified with a bank address. For example, DDR2 SDRAM is provided with four banks at the time of 512 Mb or less and is provided with eight banks at the time of 1 Gb or more. In FIGS. 23, only one memory array MA (BANK0) is representatively shown.

Figure 23B:
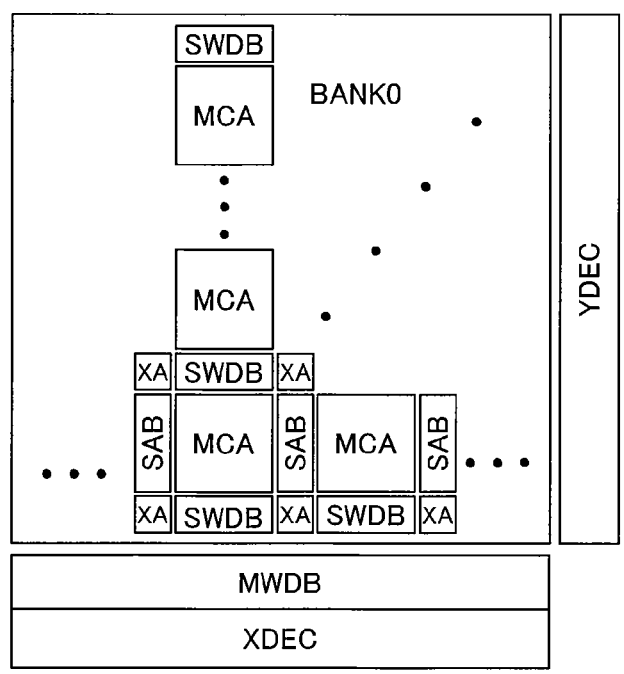
Figure 24:
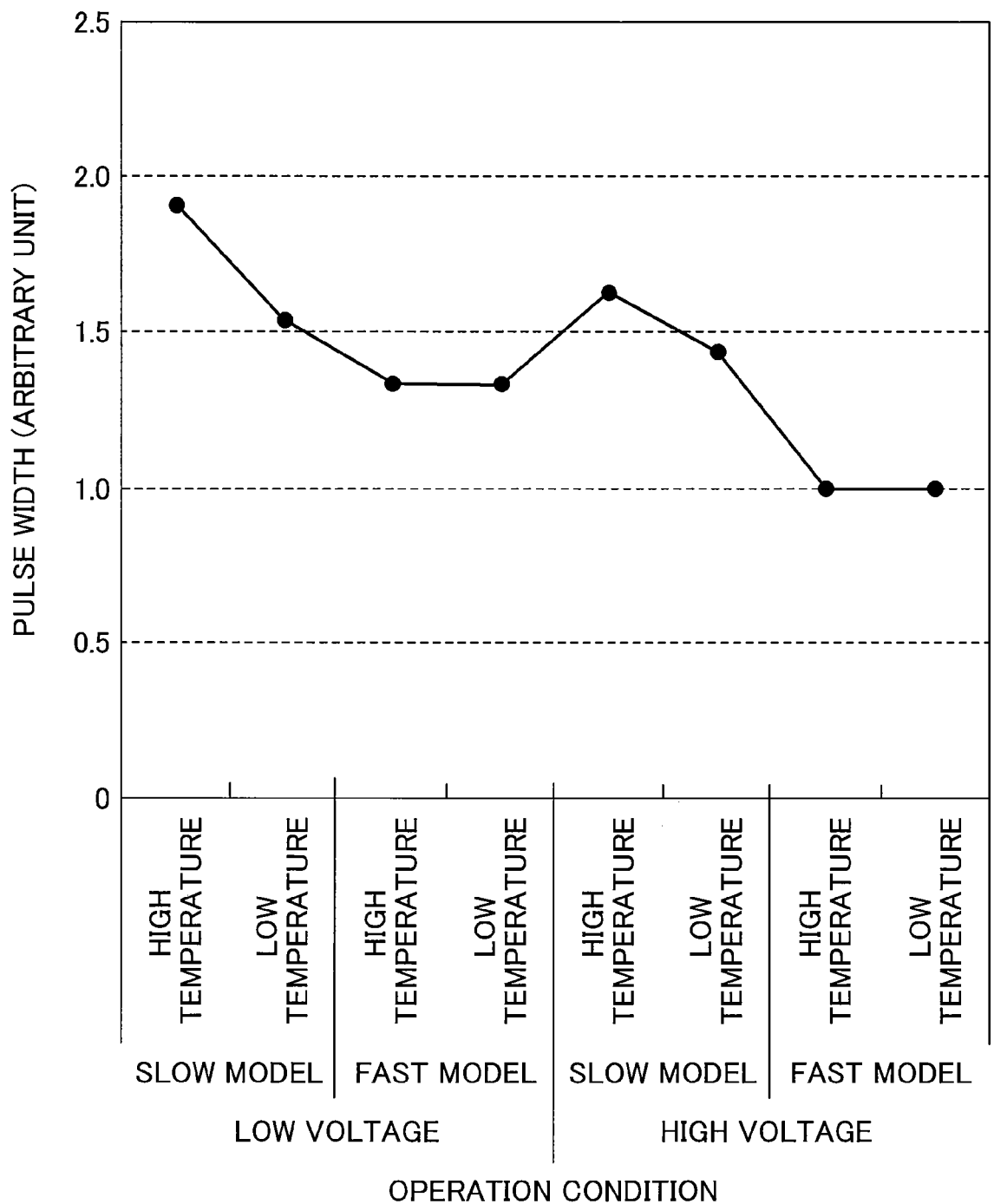
FIG. 24 shows the dependency upon a process, voltage and temperature of the delay of an inverter.
Figure 25:
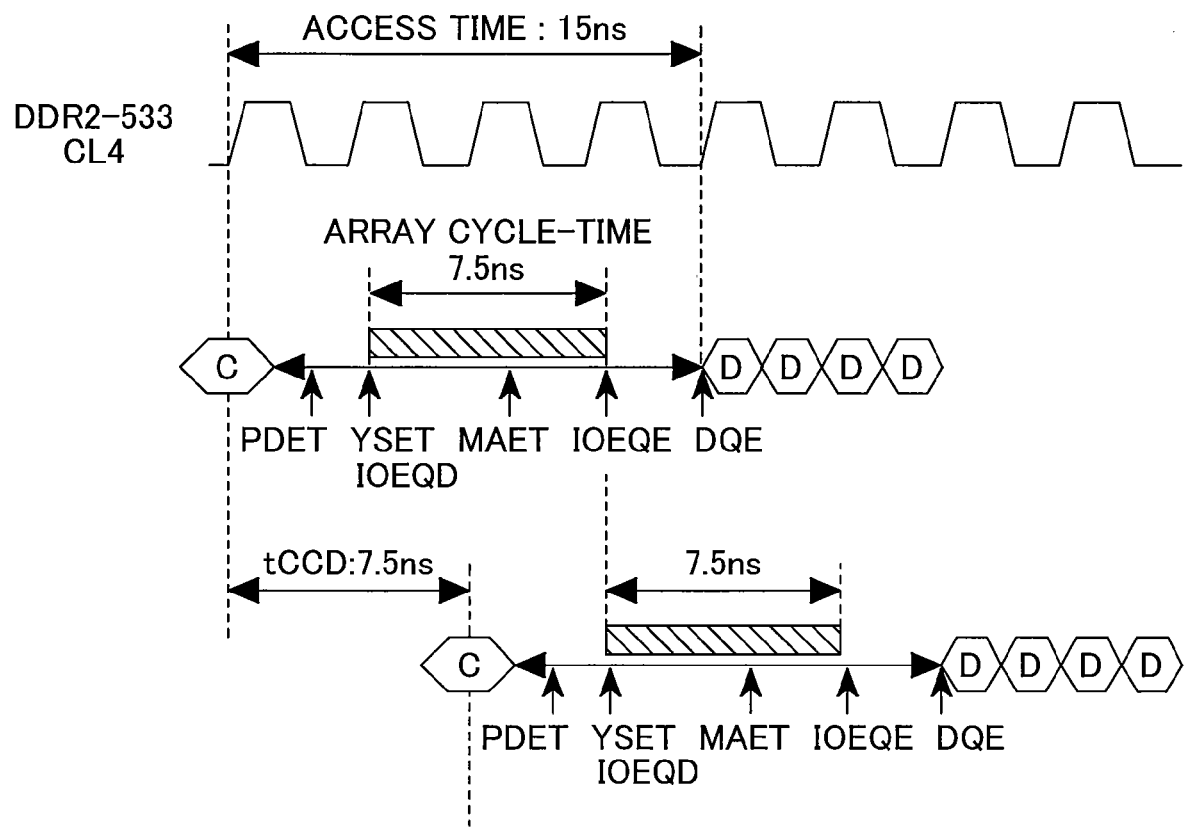
FIG. 25 shows an array operation cycle in continuous column read operation.
Figure 26:
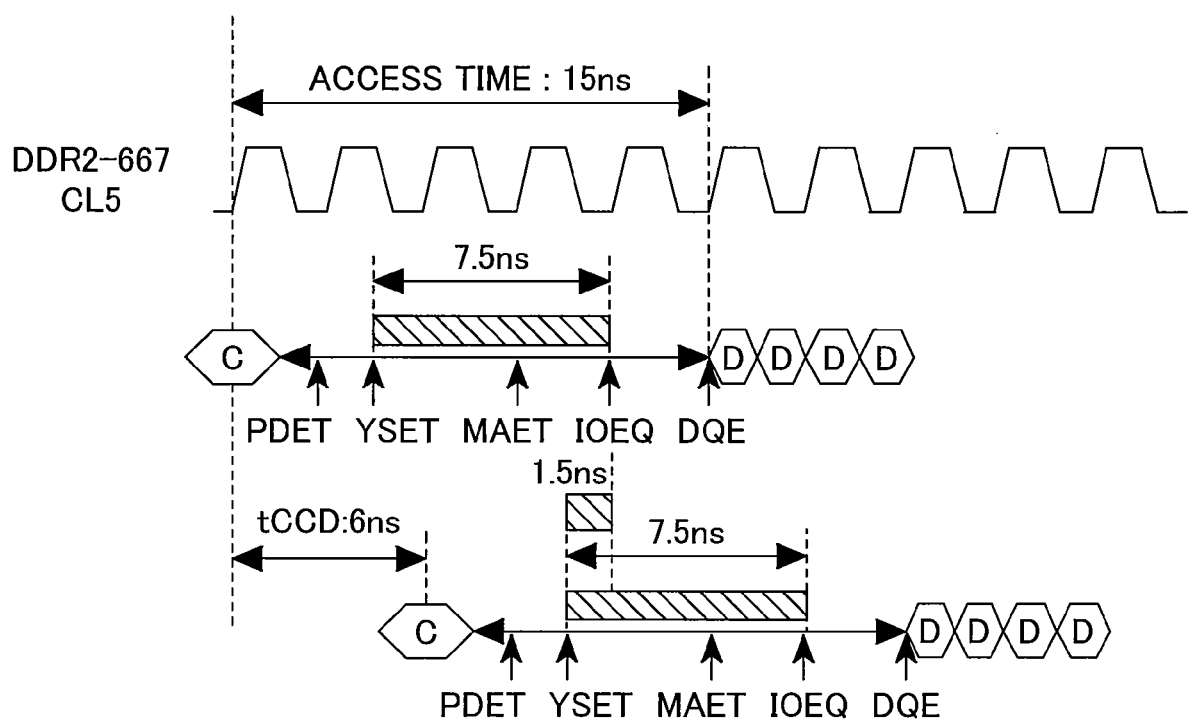
FIG. 26 shows a state in which in continuous column read operation, a column cycle is not run out.

FIG. 23B shows the logical arrangement of one memory block (bank) of DRAM to which the invention is applied. One bank of DRAM includes plural memory areas encircled by the row address decoder XDEC for selecting a word line based upon a row address and the column address decoder YDEC for selecting a data line based upon a column address, and the memory area includes plural memory subarrays (MCA) arranged in a matrix. Though the memory array is not particularly limited to it, a hierarchical word line system is adopted for the memory array and on one side of MA, a main word driver block MWDB is arranged. A main word line connected to the main word driver block MWDB is provided to an upper metal wire layer across plural memory subarrays SMA. A common column address decoder system in which plural column address selection lines (YS lines) connected to the column address decoder YDEC are provided across the plural memory subarrays SMA is adopted. In this case, the memory subarray SMA means a minimum memory array block encircled by a word driver subblock SWDB and a sense amplifier block (SAB) including plural sense amplifiers.

Next, advantages of this embodiment will be described. Both stable data input/output operation and continuous column access operation are enabled by configuring the two groups of the delay circuit group that calibrates the delay time of the delay circuits in the circuit for generating each timing signal in a column cycle in accordance with column cycle time and the delay circuit group that calibrates the delay time in accordance with access time like this configuration in operations different in column cycle time in the same access time. As the delay of the delay circuits is counted according to a clock every row operation cycle, there are advantages that the variation due to temperature, voltage and process dispersion of the delay can be reduced and stable array operation can be realized.

Circuit configuration for realizing this function is not limited to this configuration. For example, for a method of measuring clock cycle time, a delay-locked loop may be also used. In this case, as the delay of the delay elements can be calibrated according to a clock cycle at higher precision, compared with a synchronous mirror type, there is an advantage that dispersion in operational timing can be reduced.

What is claimed is:

1. A semiconductor memory device, comprising:
   a first clock having first cycle time, external signals including a control signal are inputted into the semiconductor memory device in synchronization with the first clock;
   a second clock generated in synchronization with the control signal; and
   a first delay circuit block to which the second clock is inputted, which has predetermined delay time and which outputs a signal,
   wherein the first delay circuit block has a second delay circuit block including a plurality of first delay circuits the sum of respective delay time of which is controlled to be M times (M: natural number) of the first cycle time and a third delay circuit block including a plurality of second delay circuits the sum of respective delay time of which is controlled to be N times (N: natural number) of the first cycle time.

2. The semiconductor memory device according to claim 1, wherein the ratio of the delay time of the plurality of first delay circuits is fixed.

3. The semiconductor memory device according to claim 1, wherein the ratio of the delay time of the plurality of second delay circuits is fixed.

4. The semiconductor memory device according to claim 1, wherein the sum of the natural number M and the natural number N is equal to preset column latency.

5. The semiconductor memory device according to claim 1, wherein a value of the natural number M is 2 or 4.

6. A semiconductor memory device having a plurality of word lines, a plurality of bit lines, a memory array in which a memory cell is arranged at predetermined intersections of the plurality of word lines and the plurality of bit lines, a plurality of sense amplifiers adjacent to the memory array and arranged corresponding to the bit lines, and a plurality of column selecting lines connected to the sense amplifiers, the semiconductor memory device comprising:
   a first clock having first cycle time, external signals including a control signal are inputted into the semiconductor memory device in synchronization with the first clock;
   a second clock generated in synchronization with the control signals; and
   a first delay circuit block to which the second clock is input, which has predetermined delay time and which outputs a signal,
   wherein the first delay circuit block has a second delay circuit block including a plurality of first delay circuits the sum of respective delay time of which is controlled to be M times (M: natural number) of the first cycle time, and a third delay circuit block including a plurality of second delay circuits the sum of respective delay time of which is controlled to be N times (N: natural number) of the first cycle time; and
   the predetermined number of column selecting lines of the plurality of column selecting lines are activated every the M times of cycles of the first clock.

7. The semiconductor memory device according to claim 6, comprising:
   a third clock controlled according to the first clock;
   a fourth delay circuit block to which the third clock is inputted and which includes a plurality of third delay circuits; and
   a first phase comparing circuit that compares respective phases of the third clock and clocks respectively output from the plurality of third delay circuits.

8. The semiconductor memory device according to claim 7, wherein the first delay circuit block and the second delay circuit block respectively have the plurality of third delay circuits.

9. The semiconductor memory device according to claim 7, comprising:
   a first control signal output from the first phase comparing circuit,
   wherein the first control signal is input to the first delay circuit block.

10. The semiconductor memory device according to claim 9, comprising:
    a first register that stores preset column latency;
    a plurality of second control signals output corresponding to a value of the column latency stored in the first register; and
    a third control signal generated from the first control signal and the second control signals,
    wherein the third control signal is inputted to the second delay circuit block.

11. The semiconductor memory device according to claim 10, wherein the third clock is generated from the first clock according to an input row command.

12. The semiconductor memory device according to claim 6, wherein the memory cell has one transistor and one capacitor.

13. A semiconductor memory device, comprising:
    a first clock having first cycle time, external signals including a control signal are inputted into the semiconductor memory device in synchronization with the first clock;
    an activation command and a read command respectively input in synchronization with the first clock;
    a register in which preset column latency is stored;
    a first control signal outputted corresponding to a value of the column latency stored in the register;
    a second clock generated from the first clock and the activation command;
    a third clock generated from the first clock and the read command;
    a first delay circuit block to which the second clock is inputted and which includes a plurality of first delay unit circuits;
    a second delay circuit block to which the second clock and the first control signal are inputted and which includes a plurality of second delay unit circuits;
    a second control signal output from the first delay circuit block;
    a third control signal outputted from the second delay circuit block; and a third delay circuit block including a plurality of third delay unit circuits, wherein the second control signal, the third control signal and the third clock are inputted to the third delay circuit block.

14. The semiconductor memory device according to claim 13, wherein the third delay circuit block has a first delay circuit group and a second delay circuit group;

the sum of the delay of the third delay unit circuits configuring the first delay circuit group is equivalent to M times of the first clock; and the sum of the delay of the third delay unit circuits configuring the second delay circuit group is equivalent to N times of the first clock.

15. The semiconductor memory device according to claim 13, comprising:

a write command;

a fourth clock generated from the first clock and the write command; and a fourth delay circuit block including a plurality of fourth delay unit circuits, wherein the second control signal, the third control signal and the fourth clock are inputted to the fourth delay circuit block.

16. The semiconductor memory device according to claim 15, wherein the fourth delay circuit block has a third delay circuit group and a fourth delay circuit group; and the sum of the delay of the fourth delay unit circuits configuring the third delay circuit group is equivalent to M times of the first clock.

17. The semiconductor memory device according to claim 13, comprising:

a plurality of word lines;

a plurality of bit lines;

a memory array in which a memory cell is arranged at predetermined intersections of the plurality of word lines and the plurality of bit lines;

a plurality of sense amplifiers adjacent to the memory array and arranged corresponding to the bit lines; and a plurality of column selecting lines connected to the sense amplifiers, wherein the predetermined number of column selecting lines out of the plurality of column selecting lines are activated every M times of cycles of the first clock.

18. The semiconductor memory device according to claim 17, wherein the memory cell includes one transistor and one capacitor.

* * * * *